United States Patent
Lim et al.

(10) Patent No.: US 11,956,979 B2
(45) Date of Patent: Apr. 9, 2024

(54) DISPLAY DEVICE

(71) Applicant: Samsung Display Co., LTD., Yongin-si (KR)

(72) Inventors: Sang Hyung Lim, Cheonan-si (KR); Jin Ho Jang, Cheonan-si (KR); Soon Mi Choi, Cheonan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 88 days.

(21) Appl. No.: 17/327,893

(22) Filed: May 24, 2021

(65) Prior Publication Data

US 2022/0069245 A1     Mar. 3, 2022

(30) Foreign Application Priority Data

Sep. 1, 2020   (KR) .................. 10-2020-0111134

(51) Int. Cl.
*H10K 50/115*     (2023.01)
*H10K 50/844*     (2023.01)
*H10K 59/124*     (2023.01)

(52) U.S. Cl.
CPC ......... *H10K 50/115* (2023.02); *H10K 50/844* (2023.02); *H10K 59/124* (2023.02)

(58) Field of Classification Search
CPC .. H10K 50/854; H10K 50/844; H10K 50/813; H10K 50/115; H10K 59/1201; H10K 59/124; H10K 59/38
See application file for complete search history.

(56) References Cited

U.S. PATENT DOCUMENTS

| | | | |
|---|---|---|---|
| 2014/0312319 A1* | 10/2014 | Kim | H10K 59/121 257/40 |
| 2019/0064602 A1* | 2/2019 | Kim | G02F 1/133617 |
| 2019/0310522 A1* | 10/2019 | Chu | G02F 1/133617 |

FOREIGN PATENT DOCUMENTS

| | | |
|---|---|---|
| KR | 1020140113157 A | 9/2014 |
| KR | 1020140124614 A | 10/2014 |
| KR | 1020150019325 A | 2/2015 |
| KR | 1020180125673 A | 11/2018 |
| KR | 1020190076218 A | 7/2019 |

* cited by examiner

*Primary Examiner* — Vongsavanh Sengdara
(74) *Attorney, Agent, or Firm* — CANTOR COLBURN LLP

(57) ABSTRACT

A display device includes: a display panel; and a color conversion panel overlapping the display panel, where the display panel includes a transistor disposed on a first substrate; a light-emitting element electrically connected to the transistor; and a passivation layer disposed between the transistor and the light-emitting element and including a first recess portion. The light-emitting element is disposed on the first recess portion, the color conversion panel includes a first color conversion layer, a second color conversion layer and a transmission layer, which are disposed between a second substrate and the display panel, and at least one selected from the first color conversion layer, the second color conversion layer and the transmission layer overlaps the first recess portion.

19 Claims, 21 Drawing Sheets

DISPLAY DEVICE

This application claims priority to Korean Patent Application No. 10-2020-0111134, filed on Sep. 1, 2020, and all the benefits accruing therefrom under 35 U.S.C. § 119, the content of which in its entirety is herein incorporated by reference.

BACKGROUND

(a) Field

The disclosure relates to a display device including a color conversion panel.

(b) Description of the Related Art

Recently, a display device including a color conversion panel using semiconductor nanocrystals such as quantum dots has been proposed to implement a display device with reduced light loss caused by a color filter and having high color reproducibility.

SUMMARY

In a display device including a color conversion panel, it is desired to improve structural stability of the color conversion panel and to improve light emission efficiency of light converted in color within the color conversion panel.

Embodiments are to provide a display device in which a color conversion panel and a display panel are stably combined while increasing light emission efficiency.

An embodiment of a display device includes: a display panel; and a color conversion panel overlapping the display panel. In such an embodiment, the display panel includes: a transistor disposed on a first substrate; a light-emitting element electrically connected to the transistor; and a passivation layer disposed between the transistor and the light-emitting element and including a first recess portion, where the light-emitting element is disposed on the first recess portion. In such an embodiment, the color conversion panel includes a first color conversion layer, a second color conversion layer and a transmission layer, which are disposed between a second substrate and the display panel, and at least one selected from the first color conversion layer, the second color conversion layer and the transmission layer overlaps the first recess portion.

In an embodiment, the display panel may further include an encapsulation layer disposed on the light-emitting element, and the encapsulation layer may have a flat upper surface.

In an embodiment, the encapsulation layer may include a convex part facing the first recess portion, and the encapsulation layer may include two or more regions having different thicknesses from each other.

In an embodiment, the display device may further include a filling layer disposed between the display panel and the color conversion panel.

In an embodiment, at least one selected from the first color conversion layer, the second color conversion layer, and the transmission layer may include a second recess portion facing the second substrate.

In an embodiment, the filling layer may fill the second recess portion, and the filling layer may include two or more regions having different thicknesses from each other.

In an embodiment, the first recess portion and the second recess portion may overlap each other.

In an embodiment, the first recess portion may include: a first-first recess portion overlapping the first color conversion layer; and a first-second recess portion overlapping the transmission layer, where curvatures of the first-first recess portion and the first-second recess portion may be the same as each other, and the area of the first-first recess portion may be larger than the area of the first-second recess portion.

In an embodiment, the first recess portion may include: a first-first recess portion overlapping the first color conversion layer; and a first-second recess portion overlapping the transmission layer, and a curvature of the first-first recess portion may be greater than a curvature of the first-second recess portion.

In an embodiment, a planar area of the first color conversion layer may be larger than a planar area of the transmission layer.

An embodiment of a display device includes: a display panel; and a color conversion panel overlapping the display panel. In such an embodiment, the display panel includes a transistor disposed on a first substrate, and a light-emitting element electrically connected to the transistor, and the color conversion panel includes a first color conversion layer, a second color conversion layer and a transmission layer, which are disposed between a second substrate and the display panel. In such an embodiment, each of the first color conversion layer, the second color conversion layer, and the transmission layer includes a recess portion facing the second substrate.

In an embodiment, the light-emitting element may include a flat surface.

In an embodiment, the display panel may include a passivation layer disposed between the transistor and the light-emitting element and including a first recess portion, and the recess portion included in each of the first color conversion layer, the second color conversion layer, and the transmission layer may be a second recess portion.

In an embodiment, the light-emitting element may be disposed on the first recess portion and has a concave shape.

In an embodiment, the display panel may include an encapsulation layer disposed on the light-emitting element, and an upper surface of the encapsulation layer may be flat.

In an embodiment, the encapsulation layer may include a convex part corresponding to the first recess portion, and the encapsulation layer may include two or more regions having different thicknesses from each other.

In an embodiment, the display device may further include a filling layer disposed between the display panel and the color conversion panel.

In an embodiment, the filling layer may fill the recess portion included in each of the first color conversion layer, the second color conversion layer and the transmission layer, and the filling layer may include two or more regions having different thicknesses from each other.

In an embodiment, the first recess portion may include: a first-first recess portion overlapping the first color conversion layer; and a first-second recess portion overlapping the transmission layer. In such an embodiment, the curvature of the first-first recess portion and the first-second recess portion may be the same as each other, and the area of the first-first recess portion may be larger than the area of the first-second recess portion.

In an embodiment, the first recess portion may include: a first-first recess portion overlapping the first color conversion layer; and a first-second recess portion overlapping the transmission layer, and a curvature of the first-first recess portion may be greater than a curvature of the first-second recess portion.

According to embodiments of the invention, the light emission efficiency is increased, and the color conversion panel and the display panel are stably bonded, thereby providing the display device with improved reliability.

DETAILED DESCRIPTION

Figure 1:
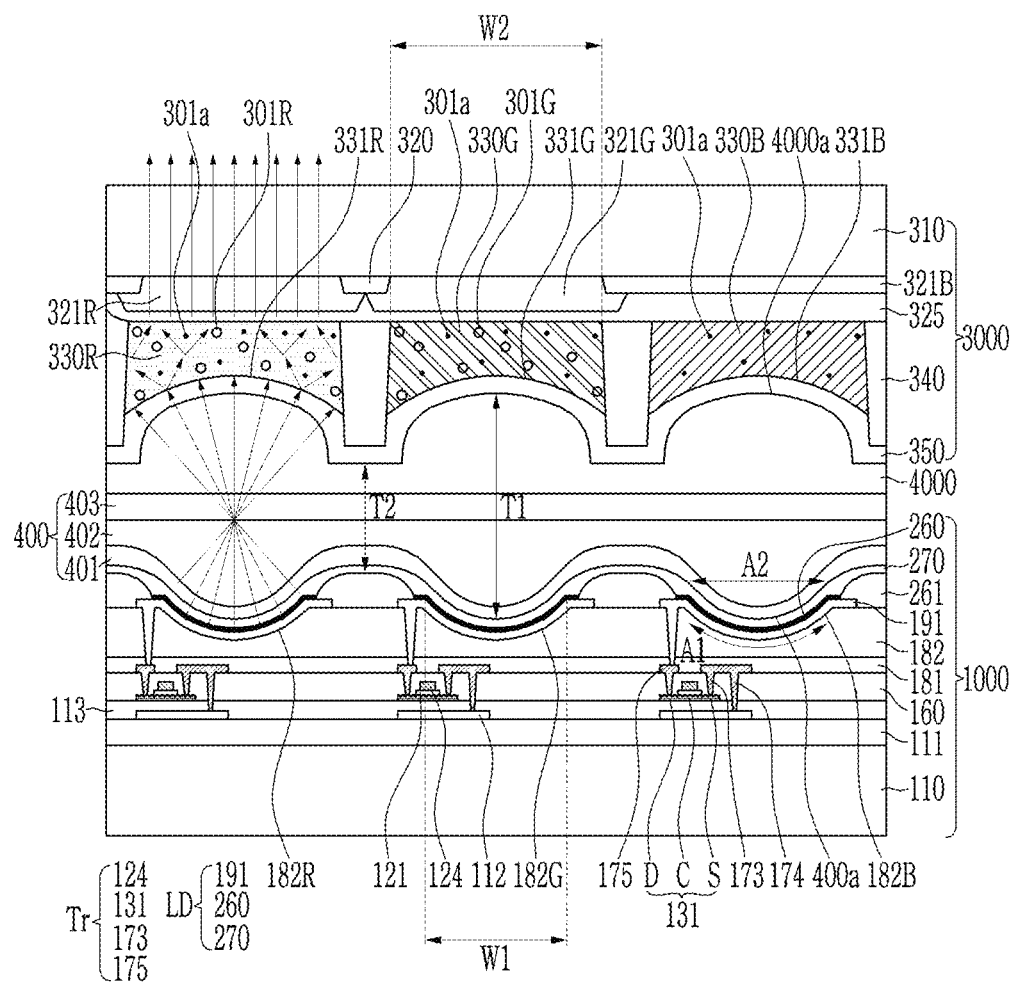
FIG. 1 is a cross-sectional view of a display device according to an embodiment.

The invention will be described more fully hereinafter with reference to the accompanying drawings, in which various embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

Further, in the drawings, a size and thickness of each element are arbitrarily represented for better understanding and ease of description, and the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, in the specification, the phrase "on a plane" means viewing the object portion from the top, and the phrase "on a cross-section" means viewing a cross-section of which the object portion is vertically cut from the side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a cross-sectional view according to a display device according to an embodiment.

Referring to FIG. 1, an embodiment of a display device includes a display panel 1000 and a color conversion panel 3000. Although not shown in the drawings, the display device may further include a touch unit, and the touch unit may be disposed between the display panel 1000 and the color conversion panel 3000 or on the color conversion panel 3000.

First, the display panel 1000 will hereinafter be described in detail.

In an embodiment, the display panel 1000 includes a first substrate 110 and a buffer layer 111 disposed on the first substrate 110. The first substrate 110 may include a plastic substrate that may be curved, bent, folded, or rolled, or may include a rigid substrate.

The buffer layer 111 may include a silicon nitride ($SiN_x$) or silicon oxide ($SiO_2$). The buffer layer 111 is disposed between the first substrate 110 and a semiconductor layer 131, to improve a characteristic of polycrystalline silicon and to reduce stress applied to the semiconductor layer 131 on the buffer 120 by blocking impurities inflowing from the substrate 110 and flattening the first substrate 110 during a crystallization process for forming the polycrystalline silicon.

In an embodiment of the display panel 1000, a metal layer 112 and an insulating layer 113 are disposed on the buffer layer 111. The metal layer 112 prevents external light from reaching the semiconductor layer 131 to prevent a characteristic deterioration of the semiconductor layer 131. The metal layer 112 may include, for example, a metal, a metal alloy, or a conductive material equivalent to the metal.

The metal layer 112 may receive a voltage from a region 174 extending from a source electrode 173 described later. Accordingly, a current change rate in a saturated region of a voltage-current characteristic graph of a transistor Tr is reduced and the characteristic of the transistor Tr as a driving transistor may be improved. Alternatively, the metal layer 112 may be connected to other signal lines or floating.

The insulating layer 113 may be an inorganic insulating layer including a silicon nitride ($SiN_x$) silicon oxide ($SiO_2$), or an organic insulating layer.

The semiconductor layer 131 is disposed on the insulating layer 113. The semiconductor layer 131 may include at least one selected from polysilicon and an oxide semiconductor. The semiconductor layer 131 includes a channel region C, a source region S, and a drain region D. The source region S and the drain region D are disposed on opposing sides of the channel region C, respectively. The channel region C may include an intrinsic semiconductor in which an impurity is not doped, and the source region S and the drain region D may include an impurity semiconductor doped with a conductive impurity. In an embodiment, the semiconductor layer 131 may include or be formed of an oxide semiconductor, and in such an embodiment, a separate passivation layer (not shown) may be added to protect the oxide semiconductor material that is vulnerable to external environments such as high temperatures.

In an embodiment of the display panel 1000, a gate insulating layer 121 overlapping the channel region C is disposed on the semiconductor layer 131. The gate insulating layer 121 may be a single layer or a multilayer including at least one selected from a silicon nitride ($SiN_x$) and silicon oxide ($SiO_2$).

In an embodiment of the display panel 1000, a gate electrode 124 is disposed on the gate insulating layer 121, and the gate electrode 124 may be a single layer or a multilayer in which a metal film including at least one material selected from copper (Cu), a copper alloy, aluminum (Al), an aluminum alloy, molybdenum (Mo) and a molybdenum alloy is deposited.

In an embodiment of the display panel 1000, an interlayer insulating layer 160 is disposed on the gate electrode 124 and the gate insulating layer 121. The interlayer insulating layer 160 may include an inorganic material such as a silicon nitride ($SiN_x$), silicon oxide ($SiO_2$), or an organic material.

The source electrode 173 and a drain electrode 175 are disposed on the interlayer insulating layer 160. The source electrode 173 and the drain electrode 175 are connected to the source region S and the drain region D of the semiconductor layer 131 through contact holes defined or formed in the interlayer insulating layer 160 and the gate insulating layer 121, respectively.

In an embodiment of the display panel 1000, passivation layers 181 and 182 are disposed on the interlayer insulating layer 160, the source electrode 173, and the drain electrode 175. In an embodiment, the passivation layers 181 and 182 may have a multilayer structure, but not being limited thereto. Alternatively, the passivation layers 181 and 182 may have a single layer structure.

The passivation layers 181 and 182 may include or be made of an organic material such as polyacryl-based resins and polyimide resins, or a laminated layer of an organic material and an inorganic material or an inorganic layer.

In an embodiment, the passivation layer 182 includes recess portions 182R, 182G, and 182B having a concave shape facing the first substrate 110. The recess portions 182R, 182G, and 182B may be formed by using a halftone mask or a slit mask.

In an embodiment, the thickness of the passivation layer 182 may become thinner toward the center of the recess portions 182R, 182G, and 182B, and the thickness of the passivation layer 182 may become thicker toward the edge of the recess portions 182R, 182G, and 182B. The recess portions 182R, 182G, and 182B may have a lens structure facing the first substrate on a cross-section.

Each of the recess portions 182R, 182G, and 182B may overlap a light-emitting element LD, which is described later. One light-emitting element LD may overlap a corresponding recess portion of the recess portions 182R, 182G, and 182B.

In an embodiment of the display panel 1000, a pixel electrode 191 is disposed on the passivation layers 181 and 182. The pixel electrode 191 is connected to the drain electrode 175 through a contact hole defined in the passivation layers 181 and 182.

The transistor Tr including the gate electrode 124, the semiconductor layer 131, the source electrode 173, and the drain electrode 175 is connected to the pixel electrode 191 to supply the current to the light-emitting element LD.

In an embodiment of the display panel 1000, a partition wall 261 is disposed on the passivation layer 182 and the pixel electrode 191, and the partition wall 261 overlaps the pixel electrode 191 and an opening defining a light-emitting region is defined through the partition wall 261. The opening may have a planar shape substantially similar to that of the pixel electrode 191. The opening may have a rhombus or octagonal shape similar to a rhombus in a plane, but is not limited thereto. Alternatively, the opening may have another shape such as a quadrangle or a polygon in a plane.

The partition wall 261 may include an organic material such as a polyacryl-based resin, a polyimide resin, or a silica-based inorganic material.

In an embodiment of the display panel 1000, an emission layer 260 is disposed on the pixel electrode 191 overlapping the opening. The emission layer 260 may include or be formed of a low-molecular organic material or a high-molecular organic material such as poly(3,4-ethylenedioxythiophene) ("PEDOT"). In an embodiment, the emission layer 260 may be a multilayer including at least one selected from a hole injection layer ("HIL"), a hole transporting layer ("HTL"), an electron transporting layer ("ETL"), and an electron injection layer ("EIL").

In an embodiment, most of the emission layer 260 may be within the opening and may also be disposed on the side or on the partition wall 261.

In an embodiment of the display panel 1000, a common electrode 270 is disposed on the emission layer 260. The common electrode 270 may be disposed over a plurality of pixels, and may receive a common voltage through a common voltage transfer unit (not shown) in a non-display area.

The pixel electrode 191, the emission layer 260, and the common electrode 270 may constitute the light-emitting element LD.

In an embodiment, the pixel electrode 191 may be an anode, which is a hole injection electrode, and the common electrode 270 may be a cathode, which is an electron injection electrode. In an alternative embodiment, the pixel electrode 191 may be the cathode and the common electrode 270 may be the anode depending on the driving method of an emissive display device.

Holes and electrons are injected into the organic emission layer 260 from the pixel electrode 191 and the common electrode 270, respectively, and light is emitted when an exciton in which the injected hole and electron are combined falls from an excited state to a ground state.

In an embodiment, the pixel electrode 191, the emission layer 260, and the common electrode 270 disposed on the recess portions 182R, 182G, and 182B may have a concave shape facing the first substrate 110 corresponding to the shape of the recess portions 182R, 182G, and 182B. In such an embodiment, each of the pixel electrode 191, the emission layer 260, and the common electrode 270 overlapping the recess portions 182R, 182G, and 182B has substantially a same concave shape as one surface of a corresponding recess portion of the recess portions 182R, 182G, and 182B.

In an embodiment, where the light-emitting element LD, particularly the emission layer 260, has a concave shape, the area of the emission layer 260 may increase. In such an embodiment, the emission layer 260 on a plane may have a width (or area) of A2 shown in FIG. 1, and when the emission layer 260 has a concave shape, the occupied area on a plane is the same as A2, but the emission layer 260 substantially has an area A1 that is greater than A2. Accordingly, in such an embodiment, the light emission area increases and then the amount of light provided to the color conversion layer 330R and 330G and the transmission layer 330B increases, such that light emission efficiency may be increased.

In an embodiment, the light emitted from the emission layer 260 having a concave shape may be emitted along the light path as shown in FIG. 1. In such an embodiment, the light output from the emission layer 260 may be condensed by an encapsulation layer 400 and then emitted again to the color conversion layer 330R. Accordingly, in such an embodiment, the emission layer 260 may provide the light to the edge of color conversion layers 330R and 330G or a transmission layer 330B, such that the light emission efficiency may be increased as the amount of the light supplied to the color conversion layers 330R and 330G or the transmission layer 330B increases.

The encapsulation layer 400 is disposed on the common electrode 270. The encapsulation layer 400 may cover and seal not only the upper surface of the light-emitting element LD, but also the side surface of the light-emitting element LD. In such an embodiment, the encapsulation layer 400 seals the light-emitting element LD, which may be vulnerable to moisture and oxygen, to block the inflow of moisture and oxygen from an outside.

The encapsulation layer 400 may include a plurality of layers. In an embodiment the encapsulation layer 400 may include a composite film including inorganic layers 401 and 403 and an organic layer 402. In an embodiment, the encapsulation layer 400 may include a triple layer in which a first inorganic layer 401, an organic layer 402, and a second inorganic layer 403 are sequentially formed one on another.

In an embodiment, the encapsulation layer 400 may include a first convex part 400a filling the first recess portions 182R, 182G, and 182B. In such an embodiment, the first inorganic layer 401 and the organic layer 402 fill the recess portions 182R, 182G, and 182B, and may have a shape protruded (or a convex shape) toward the first substrate 110. The organic layer 402 may provide a flat upper surface, so that the second inorganic layer 403 may be formed flat or to have a uniform thickness. The upper surface of the encapsulation layer 400 may be flat.

According to an embodiment, the encapsulation layer 400 may include two or more regions having different thicknesses from each other. In such an embodiment, the encapsulation layer 400 overlapping the light-emitting element LD may be thicker than the encapsulation layer 400 overlapping the partition wall 261. Therefore, the light-emitting element LD may be protected even if foreign particles inflow to the encapsulation layer 400 in the process of manufacturing the display panel 1000 or bonding the display panel 1000 and the color conversion panel 3000.

In an embodiment of the display device, the color conversion panel 3000 is disposed on the encapsulation layer 400.

The color conversion panel 3000 includes a second substrate 310 facing the first substrate 110 of the display panel 1000. The second substrate 310 may include a plastic substrate that may be well bent, curved, folded, or rolled, or may include a rigid substrate.

In an embodiment of the color conversion panel 3000, a light blocking member 320 is disposed on the second substrate 310 and prevents the light passing through the first color conversion layer 330R, the second color conversion layer 330G, and the transmission layer 330B from being mixed and recognized, thereby increasing the contrast ratio of the display device.

In an embodiment of the color conversion panel 3000, a first color filter 321R, a second color filter 321G, and a third color filter 321B are disposed on the second substrate 310 and the light blocking member 320. The first color filter 321R transmits red light that has passed through the first color conversion layer 330R and absorbs light of the remaining wavelengths, thereby increasing purity of the red light emitted toward the second substrate 310. The second color filter 321G transmits green light and absorbs light of the remaining wavelengths, thus increasing the purity of the green light emitted toward the second substrate 310, and similarly, the third color filter 321B transmits blue light and light of the remaining wavelengths, thus increasing the purity of blue light emitted toward the second substrate 310.

In an embodiment of the color conversion panel 3000, a first insulating layer 325 is disposed on the first color filter 321R, the second color filter 321G, and the third color filter 321B. The first insulating layer 325 prevents components of the first color filter 321R, the second color filter 321G, and the third color filter 321B from spreading to the outside.

In an embodiment of the color conversion panel 3000, a partition wall 340 is disposed between the first color filter 321R, the second color filter 321G, and the third color filter 321B, thereby defining boundaries therebetween. The partition wall 340 may define a region in which the first color conversion layer 330R, the second color conversion layer 330G, and the transmission layer 330B are disposed.

In the region defined by the partition wall 340, the first color conversion layer 330R, the second color conversion layer 330G, and the transmission layer 330B are disposed.

In an embodiment, each of the color conversion layers 330R and 330G and the transmission layer 330B may include a second recess portion (331R, 331G, and 331B). One surface of the color conversion layers 330R and 330G and the transmission layer 330B may have a concave shape toward the second substrate 310. Each of the color conversion layers 330R and 330G and the transmission layer 330B may have a shape that is thicker as being closer to the partition wall 340 and thinner as being farther away from the partition wall 340. In such an embodiment, each of the color conversion layers 330R and 330G and the transmission layer 330B has a thicker shape as it moves away from the center and thinner as it is closer to the center. Each of the color conversion layers 330R and 330G and the transmission layer 330B may have a lens structure on a cross-section.

According to an embodiment, an area occupied by the emission layer 260 and an area occupied by the color conversion layer 330R may be different from each other. In an embodiment, each width W2 of the color conversion layers 330R and 330G and the transmission layer 330B may be greater than the width W1 of the emission layer 260 on a plane.

In a color conversion layer, if a surface of the emission layer 260 facing the color conversion layers 330R and 330G and the transmission layer 330B is flat and the emission layer 260 emits light in the vertical direction with respect to the first substrate 110, the light may not reach the edges of the color conversion layers 330R and 330G and the transmission layer 330B. However, according to an embodiment, the emission layer 260 has the concave shape, such that the light emitted from the emission layer 260 may be collected toward the encapsulation layer 400 and then again spread toward the color conversion layers 330R and 330G and the transmission layer 330B. According to this optical path, the light emitted from the emission layer 260 may be provided to the edges of the color conversion layers 330R and 330G and the transmission layer 330B. The color conversion layers 330R and 330G and the transmission layer 330B may receive more light to increase the amount of light emitted from the color conversion layers 330R and 330G and the transmission layer 330B.

The display panel 1000, which provides light to the color conversion panel 3000, may emit light of a first wavelength, and the transmission layer 330B transmits light of the first wavelength and includes a plurality of scattering members 301a.

The light of the first wavelength may be the blue light having a maximum emission peak wavelength in a range of about 380 nanometers (nm) to about 480 nm, for example, about 420 nm or greater, about 430 nm or greater, about 440 nm or greater, or about 445 nm or greater, and about 470 nm or less, about 460 nm or less, or about 455 nm or less.

The first color conversion layer 330R color-converts light of the first wavelength incident from the display panel 1000 into the red light, and includes a plurality of scattering members 301a and a plurality of first semiconductor nanocrystals 301R. The red light may have a maximum emission peak wavelength in a range of about 600 nm to about 650 nm, for example, in a range of about 620 nm to about 650 nm.

The second color conversion layer 330G color-converts light of the first wavelength incident from the display panel 1000 into the green light, and includes a plurality of scattering members 301a and a plurality of second semiconductor nanocrystals 301G. The green light may have a maximum emission peak wavelength in a range of about 500 nm to about 550 nm, for example, about 510 nm to about 550 nm.

The plurality of scattering members 301a may increase light efficiency by scattering light incident on the first color conversion layer 330R, the second color conversion layer 330G, and the transmission layer 330B.

Each of the first semiconductor nanocrystals 301R and the second semiconductor nanocrystals 301G may independently include at least one selected from a Group II-VI compound, a Group III-V compound, a Group IV-VI compound, a Group IV element or compound, a Group compound, a Group compound, a Group I-II-IV-VI compound, and a combination thereof. In such an embodiment, the quantum dots may not contain cadmium.

The Group II-VI compound may include at least one selected from: a binary compound including CdSe, CdTe, ZnS, ZnSe, ZnTe, ZnO, HgS, HgSe, HgTe, MgSe, MgS, and a mixture thereof; a ternary compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound including HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal.

The Group III-V compound may include at least one selected from: a binary compound including GaN, GaP, GaAs, GaSb, AlN, AlP, AlAs, AlSb, InN, InP, InAs, InSb, and a mixture thereof; a ternary compound including GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a Group II metal (e.g., InZnP).

The Group IV-VI compound may include at least one selected from: a binary compound including SnS, SnSe, SnTe, PbS, PbSe, PbTe, and a mixture thereof; a ternary compound including SnSeS, SnSeTe, SnSTe, PbSeS, PbSeTe, PbSTe, SnPbS, SnPbSe, SnPbTe, and a mixture thereof; and a quaternary compound including SnPbSSe, SnPbSeTe, SnPbSTe, and a mixture thereof.

The Group IV element or compound may include at least one selected from: a single element compound including Si, Ge, and combinations thereof; and a binary element compound including SiC, SiGe, and combinations thereof.

In one embodiment, for example, the Group compound includes at least one selected from CuInSe2, CuInS2, CuInGaSe, and CuInGaS, but is not limited thereto. In one embodiment, for example the Group I-II-IV-VI includes at least one selected from CuZnSnSe and CuZnSnS, but is not limited thereto. The Group IV element or compound may include at least one selected from: a single element compound including Si, Ge, and combinations thereof; and a binary element compound including SiC, SiGe, and combinations thereof.

The Group II-III-VI compound may include at least one selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and combinations thereof.

The Group I-II-IV-VI compound may include at least one selected from CuZnSnSe and CuZnSnS, but is not limited thereto.

In an embodiment, the quantum dots may not contain cadmium. The quantum dots may include a semiconductor nanocrystal based on a Group III-V compound including indium and phosphorus. The Group III-V compound may further include zinc. The quantum dots may include a semiconductor nanocrystal based on a Group II-VI compound including a chalcogen element (e.g., sulfur, selenium, tellurium, or combinations thereof) and zinc.

In the quantum dots, the binary compound, the ternary compound, or the quaternary compound as above-described may each be in a particle from at a uniform concentration or included in a same particle of which a concentration distribution may be partially divided into different states. Also, the quantum dots may have a core/shell structure in which one quantum dot surrounds another quantum dot. The interface between the core and the shell may have a concentration gradient in which the concentration of the elements in the shell decreases toward the center.

In an embodiment, the quantum dots may have a core-shell structure including a core including the above-described nanocrystal and a shell surrounding the core. The shell of the quantum dot may act as a protective layer for maintaining the semiconductor characteristic by preventing a chemical modification of the core and/or a charging layer for imparting an electrophoretic characteristic to the quantum dot. The shell may be single-layered or multi-layered. An interface between the core and the shell may have a concentration gradient in which the concentration of elements in the shell decreases toward the center. In one embodiment, for example, the shell of the quantum dot include a metal or non-metal oxide, a semiconductor compound, or a combination thereof.

In one embodiment, for example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the invention is not limited thereto.

In one embodiment, for example, the semiconductor compound may include at least one material selected from CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the invention is not limited thereto.

An interface between the core and the shell may have a concentration gradient, such that a concentration of an element existing in the shell is gradually reduced as being nearer to the center thereof. In addition, the semiconductor nanocrystals may have a structure including one semiconductor nanocrystal core and multi-layered shells surrounding the core. In an embodiment, the multi-layered shells may have two or more layers, for example, two, three, four, five, or more layers. Two adjacent layers of the shell may have a single composition or different compositions. In the multi-layered shell, each layer may have a composition that varies along the radius.

The quantum dots may have a full width at half maximum ("FWHM") of about 45 nm or less, e.g., about 40 nm or less, or about 30 nm or less, and may improve color purity or color reproducibility in this range. In such an embodiment, since light emitted through the quantum dots is emitted in all directions, a wide viewing angle may be improved.

In the quantum dots, the shell material and the core material may have different energy bandgaps from each other. In one embodiment, for example, the energy bandgap of the shell material may be greater than that of the core material. Alternatively, the energy bandgap of the shell material may be smaller than that of the core material. The quantum dots may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

The quantum dots may control an absorption/emission wavelength by adjusting a composition and a size thereof. A maximum peak emission wavelength of the quantum dot may be an ultraviolet ("UV") to infrared wavelength or a wavelength of greater than the above wavelength range.

The quantum dots may include an organic ligand (e.g., having a hydrophobic moiety or a hydrophilic moiety). The organic ligand moiety may be bound to a surface of the quantum dots. The organic ligand may include at least one selected from RCOOH, $RNH_2$, $R_2NH$, $R_3N$, RSH, $R_3PO$, $R_3P$, ROH, RCOOR, $RPO(OH)_2$, RHPOOH, RHPOOH, and a combination thereof, where R is independently a C3 to C40 substituted or unsubstituted aliphatic hydrocarbon group such as a C3 to C40 (e.g., C5 or greater and C24 or less) substituted or unsubstituted alkyl, or a substituted or unsubstituted alkenyl, a C6 to C40 (e.g., C6 or greater and C20 or less) substituted or unsubstituted aromatic hydrocarbon group such as a substituted or unsubstituted C6 to C40 aryl group, or a combination thereof.

In one embodiment, for example, the organic ligand may include at least one selected from: a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octylphosphine, dioctyl phosphine, tributylphosphine, or trioctylphosphine; a phosphine compound or an oxide compound thereof such methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, or trioctylphosphine oxide; a diphenyl phosphine, triphenyl phosphine compound, or an oxide compound thereof; a C5 to C20 alkyl phosphonic acid such as hexylphosphinic acid, octylphosphinic acid, dodecanephosphinic acid, tetradecanephosphinic acid, hexadecanephosphinic acid, octadecanephosphinic acid; and the like, but are not limited thereto. The quantum dots may include a hydrophobic organic ligand alone or in a mixture of at least one type. The hydrophobic organic ligand may not include a photopolymerizable moiety (e.g., an acrylate group, a methacrylate group, etc.).

In an embodiment of the color conversion panel 3000, a second insulating layer 350 is disposed between the first color conversion layer 330R, the second color conversion layer 330G, and the transmission layer 330B, and the display panel 1000. The second insulating layer 350 covers and protects the first color conversion layer 330R, the second color conversion layer 330G, and the transmission layer 330B, so that a component of a filling layer 4000 injected when the color conversion panel 3000 is attached to the display panel 1000 is prevented from inflowing into the first color conversion layer 330R, the second color conversion layer 330G, and the transmission layer 330B.

The second insulating layer 350 is disposed along the first color conversion layer 330R, the second color conversion layer 330G, and the transmission layer 330B and may have the concave shape. The second insulating layer 350 may overlap the second recess portions 331R, 331G, and 331B. The second insulating layer 350 may have a substantially uniform thickness with respect to the second substrate 310.

The filling layer 4000 is disposed between the display panel 1000 and the color conversion panel 3000. After manufacturing each of the display panel 1000 and the color conversion panel 3000, the display panel 1000 and the color conversion panel 3000 are disposed to face each other and the filling layer 4000 is filled between the display panel 1000 and the color conversion panel 3000 to be assembled, thereby forming the display device.

In an embodiment, the filling layer 4000 may have a convex shape facing the second substrate 310. In such an embodiment, the filling layer 4000 may have the convex shape while filling the second recess portions 331R, 331G, and 331B of the color conversion layers 330R and 330G and the transmission layer 330B. The filling layer 4000 may include two or more regions having different thicknesses with respect to the second substrate 310. In one embodiment, for example, the thickness of the filling layer 4000 overlapping the color conversion layers 330R and 330G and the transmission layer 330B may be greater than the thickness of the filling layer 4000 overlapping the partition wall 340.

In a state where the display panel 1000 and the color conversion panel 3000 are combined, the filling layer 4000 and the encapsulation layer 400 may be disposed between the light-emitting element LD and the color conversion layers 330R and 330G or between the light-emitting element LD and the transmission layer 330B.

The filling layer 4000 and the encapsulation layer 400 have a first thickness T1 in the region where the light-emitting element LD and the color conversion layers 330R and 330G overlap each other, and a second thickness T2 in the region where the partition wall 261 of the display panel 1000 and the partition wall 340 of the color conversion panel 3000 overlap each other. The first thickness T1 may be greater than the second thickness T2.

In a process of combining the display panel 1000 and the color conversion panel 3000, foreign particles may inflow to the filling layer 4000 or the encapsulation layer 400. If the foreign particles inflow to the color conversion layers 330R and 330G, the transmission layer 330B, or the light-emitting element LD, the reliability of the display device may be lowered. In an embodiment, as the first thickness T1 increases, the color conversion layers 330R and 330G, the transmission layer 330B, and the light-emitting element LD may be effectively prevented from being damaged even if the foreign particles are inflowed. In such an embodiment, by reducing the second thickness T2, the entire thickness of the device may be reduced.

Herein, for convenience of description, embodiments where the display panel 1000 is an organic light-emitting panel are described in detail. However, the type of the display panel 1000 is not limited thereto, and the display panel 1000 may be one of other various types of display panel. In one embodiment, for example, the display panel 1000 may be a liquid crystal display panel, an electrophoretic display panel, or an electrowetting display panel. In an embodiment, the display panel 1000 may be a next-generation display panel such as a micro-light-emitting diode ("LED") ("micro-LED") display panel, a quantum dot LED ("QLED") display panel, and a quantum dot organic light-emitting diode ("QD-OLED") display panel.

The micro LED display panel is a type of display panel in which 10 to 100 micrometer-sized LED is included in each pixel. Such micro LED display panels have desired characteristics such as using inorganic materials, omitting the color filters and backlights, having a fast reaction speed, realizing high luminance with low power, and not being broken when bending. The QLED display panel may be manufactured by a method of attaching a film containing quantum dots or depositing a material containing quantum dots. The quantum dots include or are made of inorganic materials such as indium, cadmium, etc., the quantum dots emit light by themselves, and are particles with a diameter of several nanometers or less. By adjusting the particle size of the quantum dots, it is possible to display light of a desired color. The QD-OLED display panel is manufactured by a method using a blue organic light-emitting diode as a light source, and attaching a film including red and green quantum dots thereon or depositing a material including red and green quantum dots to implement a color. In an embodiment, the display panel 1000 may be one of various types of display panel as described above.

Hereinafter, various embodiments of the display device will be described in detail with reference to FIG. 2 to FIG. 13. Hereinafter, any repetitive detailed description of the same or like constituent elements of such embodiments that are the same as those of the embodiments described above with reference to FIG. 1 will be omitted or simplified.

Figure 2:
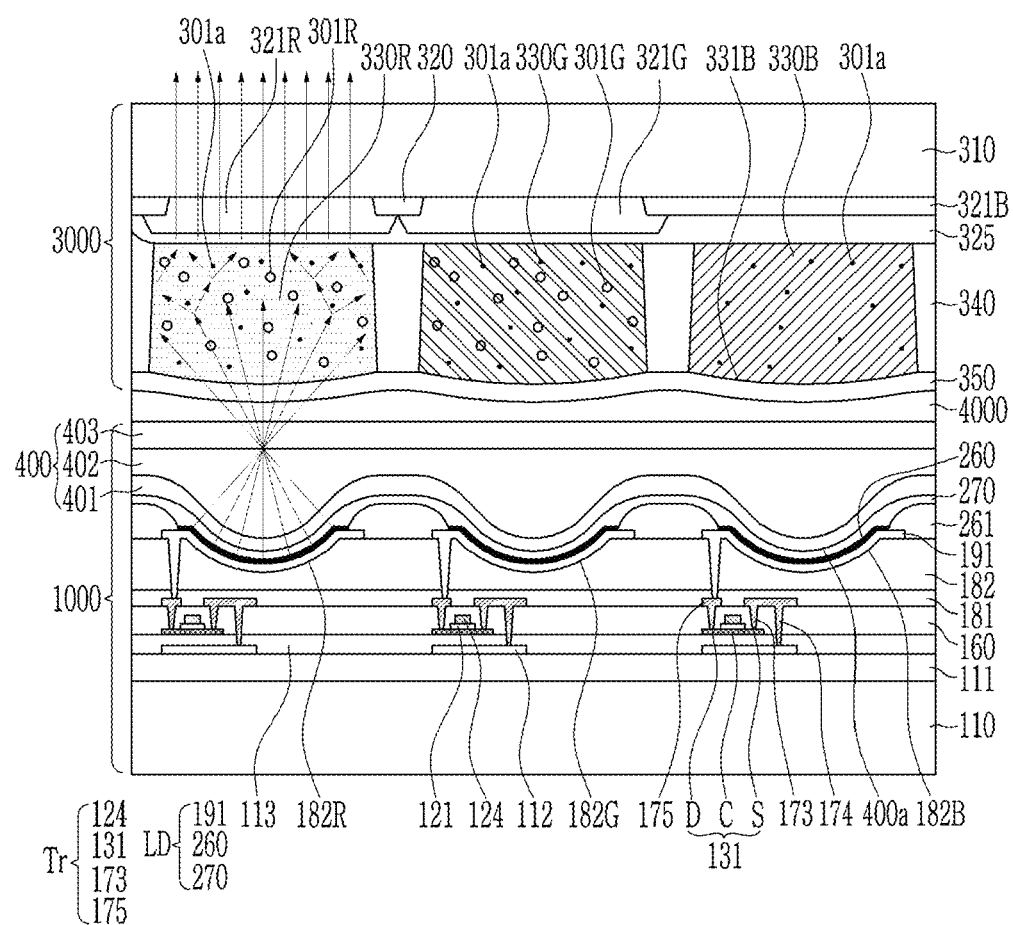
FIG. 2 is a cross-sectional view of a display device according to an embodiment.
Figure 3:
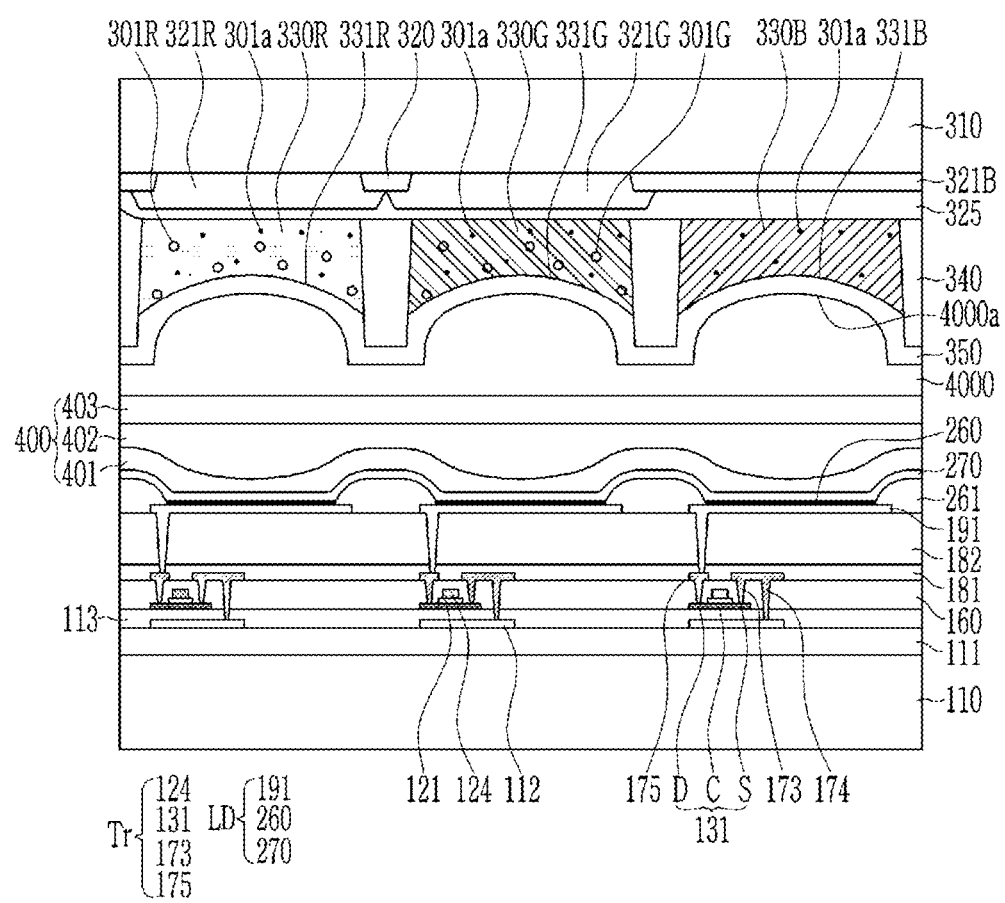
FIG. 3 is a cross-sectional view of a display device according to an embodiment.
Figure 4:
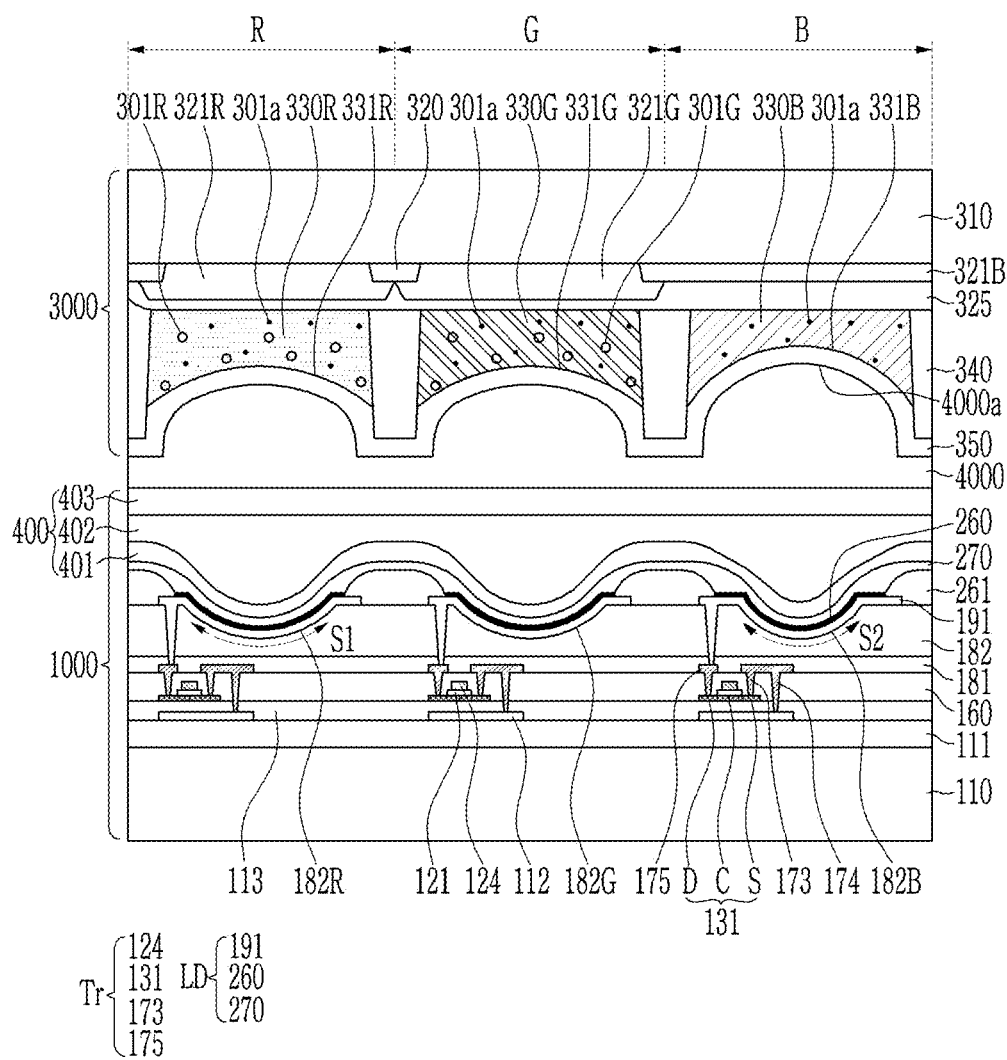
FIG. 4 is a cross-sectional view of a display device according to an embodiment.
Figure 5:
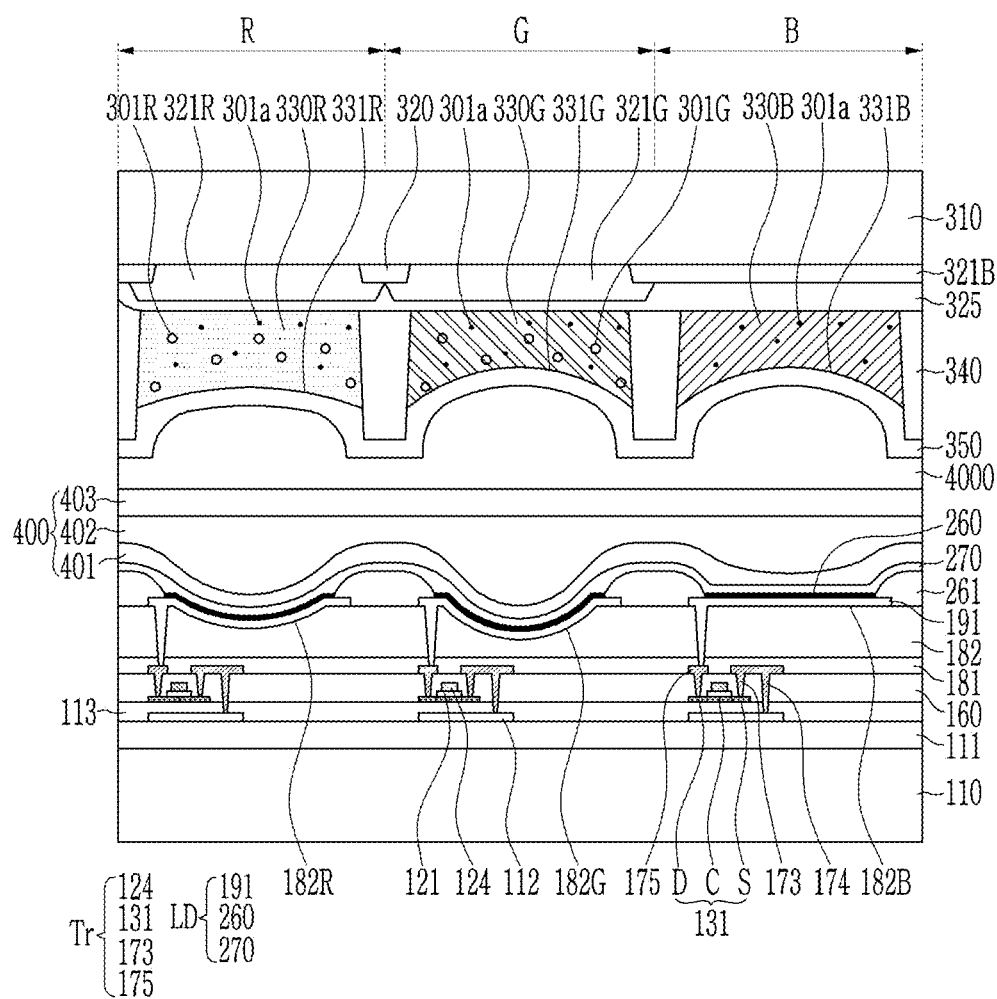
FIG. 5 is a cross-sectional view of a display device according to an embodiment.
Figure 6:
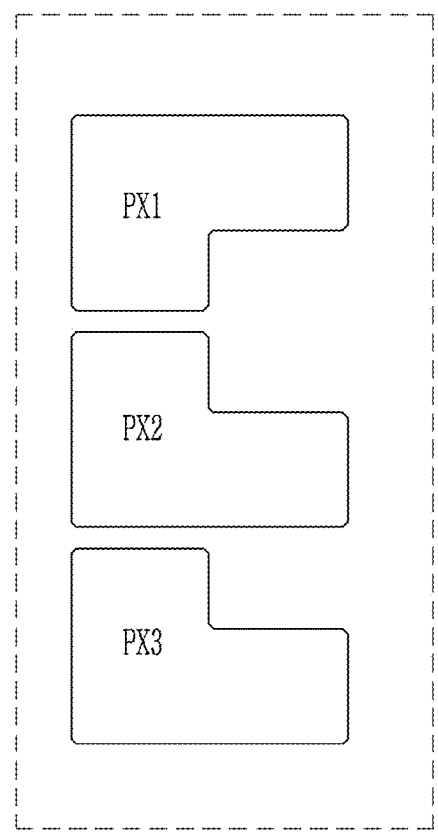
FIG. 6 is a top plan view of a display device according to an embodiment.
Figure 7:
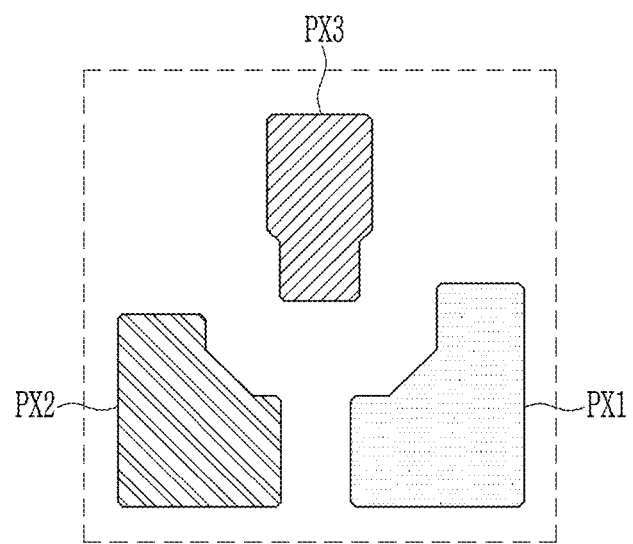
FIG. 7 is a top plan view of a display device according to an embodiment.

FIG. 2 is a cross-sectional view of a display device according to an embodiment, FIG. 3 is a cross-sectional view of a display device according to an embodiment, FIG. 4 is a cross-sectional view of a display device according to an embodiment, FIG. 5 is a cross-sectional view of a display device according to an embodiment, FIG. 6 is a top plan view of a display device according to an embodiment, FIG. 7 is a top plan view of a display device according to an embodiment, and FIG. 8, FIG. 9, FIG. 10, FIG. 11, FIG. 12, and FIG. 13 are cross-sectional views of a display device according to embodiments.

First, referring to FIG. 2, an embodiment of the display device may include the display panel 1000 of FIG. 1.

In such an embodiment, as shown in FIG. 2, the color conversion panel 3000 includes a light blocking member 320, a first color filter 321R, a second color filter 321G, and a third color filter 321B, which are disposed on a second substrate 310. A first insulating layer 325 is disposed between the first color filter 321R, the second color filter 321G, and the third color filter 321B, and the display panel 1000.

A partition wall 340 overlapping the partition wall 261 of the display panel 1000 is disposed on the first insulating layer 325.

The first color conversion layer 330R, the second color conversion layer 330G and the transmission layer 330B may be disposed between the adjacent partition wall 340. The first color conversion layer 330R, the second color conversion layer 330G and the transmission layer 330B may have a substantially same height as the partition wall 340. According to an embodiment, each of the first color conversion layer 330R, the second color conversion layer 330G, and the transmission layer 330B may have a slightly more convex shape than the partition wall 340, but is not limited thereto. Alternatively, each of the first color conversion layer 330R, the second color conversion layer 330G, and the transmission layer 330B may have a slightly less concave shape than the partition wall 340.

The upper surface of the partition wall 340 facing the display panel 1000, the upper surface of the first color conversion layer 330R, the upper surface of the second color conversion layer 330G, and the upper surface of the transmission layer 330B may be on a same level or collectively define a flat surface.

The second insulating layer 350 is disposed on the upper surface of the partition wall 340 facing the display panel 1000, the upper surface of the first color conversion layer 330R, the upper surface of the second color conversion layer 330G, and the upper surface of the transmission layer 330B.

A filling layer 4000 may be disposed between the color conversion panel 3000 and the display panel 1000. The filling layer 4000 may be disposed between the display panel 1000 and the color conversion panel 3000, which have the substantially flat surfaces. In an embodiment, the filling layer 4000 may be disposed between one surface of the encapsulation layer 400 and one surface of the second insulating layer 350. The filling layer 4000 may have substantially a same or uniform thickness over the entire surface of the first substrate 110.

In an embodiment, the display panel 1000 may include a convex part 400a filling the first recess portions 182R, 182G, and 182B and the first recess portions 182R, 182G, and 182B. Accordingly, the thickness from the upper surface of the encapsulation layer 400 to the upper surface of the light-emitting element LD may be increased. The light-emitting element LD may be effectively prevented from being damaged by foreign particles inflowing in the process of combining the display panel 1000 and the color conversion panel 3000.

In such an embodiment, since the light-emitting element LD has the concave shape, the light-emitting element LD provides more light to the color conversion layers 330R and 330G and the transmission layer 330B, thereby increasing the emission light amount from the color conversion panel 3000 and the light conversion efficiency.

Next, referring to FIG. 3, in an embodiment, a color conversion panel 3000 may be substantially the same as the color conversion panel 3000 of FIG. 1.

In such an embodiment, a display panel 1000 includes a transistor Tr disposed on a first substrate 110 and a light-emitting element LD electrically connected to the transistor Tr. Passivation layers 181 and 182 are disposed between the light-emitting element LD and the transistor Tr. In an embodiment, the passivation layers 181 and 182 may provide a flat upper surface.

The pixel electrode 191 disposed on the passivation layers 181 and 182 may have a flat surface. In such an embodiment, the emission layer 260 and the common electrode 270 disposed on the pixel electrode 191 may also have a flat surface. In such an embodiment, the light-emitting element LD may emit light on an almost flat surface.

In an embodiment, the color conversion panel 3000 includes the first color conversion layer 330R, the second color conversion layer 330G, and the transmission layer 330B, which are disposed on the second substrate 310. In such an embodiment, each of the first color conversion layer 330R, the second color conversion layer 330G, and the transmission layer 330B may include recess portions 331R, 331G, and 331B facing the second substrate 310.

A second insulating layer 350 may be disposed between the first color conversion layer 330R, the second color conversion layer 330G, the transmission layer 330B, and the partition wall 340, and the display panel 1000. The filling layer 4000 may be disposed between the second insulating layer 350 and the display panel 1000.

The filling layer 4000 may have a shape filling the recess portion 331R, 331G, and 331B of the first color conversion layer 330R, the second color conversion layer 330G, and the transmission layer 330B. The filling layer 4000 may include a convex part 4000a protruded toward the second substrate 310. The convex part 4000a of the filling layer 4000 may overlap the light-emitting region of the display panel 1000.

In a process of bonding the color conversion panel 3000 and the display panel 1000, foreign particles may be inflowed. In the region where the light-emitting element LD of the display panel 1000 and the color conversion layers 330R and 330G overlap each other, or the region where the light-emitting element LD and the transmission layer 330B overlap each other, the thickness of the filling layer 4000 may be thick by the recess portions 331R, 331G, and 331B. In such an embodiment, the thickness of the filling layer 4000 overlapping the partition wall 340 may be thinner than the thickness of the filling layer 4000 overlapping the color conversion layers 330R and 330G and the transmission layer 330B. In such an embodiment, the filling layer 4000 may include two or more regions having different thicknesses from each other.

In such an embodiment, even if foreign particles inflow, the light-emitting element LD may be effectively prevented from being damaged or the color conversion layers 330R and 330G, and the transmission layer 330B may be effectively prevented from being damaged by the relatively thick filling layer 4000. In such an embodiment, by maintaining the thickness of the filling layer 4000 overlapping the partition wall 340 thin, the thickness of the device may be reduced.

Next, an embodiment of the display device will be described with reference to FIG. 4.

According to an embodiment of the display device, as shown in FIG. 4, a first-first recess portion 182R of the passivation layer 182 disposed in the red light emission region R and a first-second recess portion 182B of the passivation layer 182 disposed in the blue light emission region B may have substantially a same curvature as each other. Herein, the term "curvature" may mean a radius of curvature.

In such an embodiment, an area S1 of the first-first recess portion 182R of the passivation layer 182 disposed in the red light emission region R may be greater than an area S2 of the first-second recess portion 182B of the passivation layer 182 disposed in the blue light emission region B. In such an embodiment, the area of the emission layer 260 positioned on the first-first recess portion 182R overlapping the red light emission region R may be greater than the area of the emission layer 260 positioned on the first-second recess portion 182B overlapping the blue light emission region B.

According to an embodiment, the blue light emission region B transmits light emitted from the light-emitting element LD as it is, and the red light emission region R converts light emitted from the light-emitting element LD into red light and emits it. In such an embodiment, the light conversion efficiency for converting incident light into red light may be less than about 100%.

Therefore, the area of the emission layer positioned in the recess portion 182R overlapping the red light emission region R is provided to be greater than the area of the emission layer positioned in the recess portion 182B overlapping the blue light emission region B, thereby light of a greater amount may be provided to a first color conversion layer 330R. Since the first color conversion layer 330R receives a relatively large amount of light compared to the transmission layer 330B, the amount of light emitted from the first color conversion layer 330R may increase.

Embodiment of FIG. 4 is described by comparing the red light emission region R and the blue light emission region B, however it is not limited thereto, and is also applicable to the green light emission region G and the blue light emission region B.

Next, an embodiment of the display panel 1000 will be described with reference to FIG. 5. In such an embodiment, the first-first recess portion 182R of the passivation layer 182 positioned in the red light emission region R and the first-second recess portion 182B of the passivation layer 182 positioned in the blue light emission region B may have different curvatures from each other. According to an embodiment, the curvature of the first-first recess portion 182R of the passivation layer 182 positioned in the red light emission region R may be greater than that of the first-second recess portion 182B of the passivation layer 182 positioned in the blue light emission region B may be different. In such an embodiment, the area of the emission layer 260 positioned in the red light emission region R may be larger than the area of the emission layer 260 positioned in the blue light emission region B.

The light-emitting element LD positioned in the red light emission region R) may provide a greater amount of light to the first color conversion layer 330R. Since the first color conversion layer 330R receives a relatively large amount of light compared to the transmission layer 330B, the amount of light emitted from the first color conversion layer 330R may be increased.

The embodiment of FIG. 5 is described by comparing the red light emission region R and the blue light emission region B, however it is not limited thereto and is also applicable to the green light emission region G and the blue light emission region B.

Next, a schematic plane of the color conversion panel 3000 according to an embodiment will be described with reference to FIG. 6 and FIG. 7.

In an embodiment, as shown in FIG. 6 and FIG. 7, the display device may include a plurality of pixels PX1, PX2, and PX3. In such an embodiment, the first pixel PX1 may be a pixel that displays red, the second pixel PX2 may be a pixel that displays green, and the third pixel PX3 may be a pixel that displays blue.

In an embodiment, as shown in FIG. 6, a plurality of pixels PX1, PX2, and PX3 have a same planar area as each other, or alternatively, as shown in FIG. 7, a plurality of pixels PX1, PX2, and PX3 may have different planar areas from each other. In one embodiment, for example, the area of the third pixel PX3 for displaying blue may be smaller than the area of the first pixel PX1 for displaying red and the area of the second pixel PX2 for displaying green In an embodiment, as shown in FIG. 6 and FIG. 7, a plurality of pixels PX1, PX2, and PX3 may have various planar shapes and plane arrangements, but are not limited thereto.

According to an embodiment, the first color conversion layer 330R may have a planar shape similar to that of the first pixel PX1, the second color conversion layer 330G may have a planar shape similar to that of the second pixel PX2, and the transmission layer 330B may have a planar shape similar to that of the third pixel PX3. In an embodiment, the first recess portions 182R, 182G, and 182B and the second recess portions 331R, 331G, and 331B may have a circular shape on a plane or a shape similar to the first pixel PX1 to third pixel PX3 on a plane, but are not limited thereto.

Figure 8:
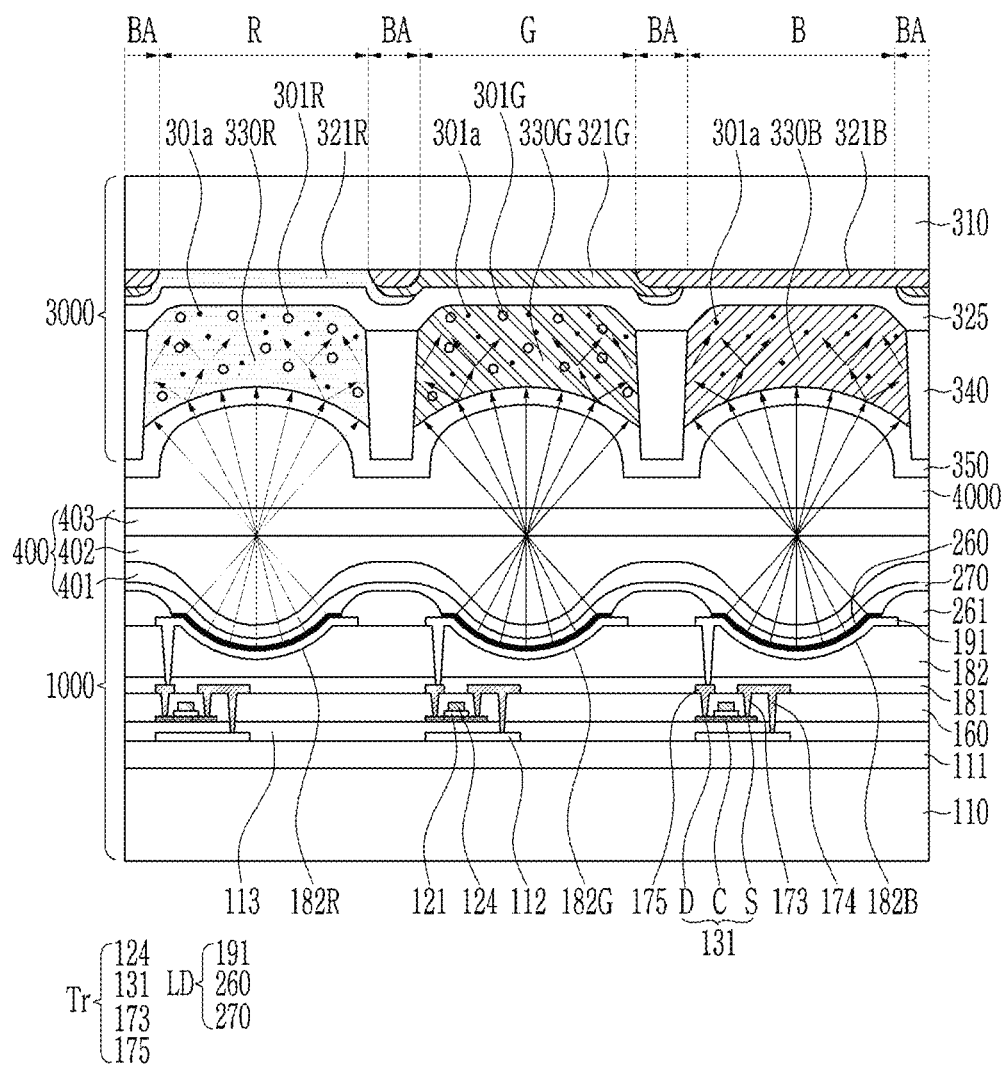
FIG. 8, FIG. 9, FIG. 10, FIG. 11, FIG. 12, and FIG. 13 are cross-sectional views of a display device according to embodiments.

Referring to FIG. 8, in an alternative embodiment, the color conversion panel 3000 includes a first color filter 321R disposed between the second substrate 310 and the first color conversion layer 330R. The first color filter 321R may increase the color purity of light emitted from the first color conversion layer 330R by blocking light transmitted to the second substrate 310 without the color conversion in the first color conversion layer 330R.

In an embodiment, the color conversion panel 3000 includes a second color filter 321G disposed between the second substrate 310 and the second color conversion layer 330G. The second color filter 321G may increase the color purity of light emitted from the second color conversion layer 330G by blocking light transmitted to the second substrate 310 without the color conversion in the second color conversion layer 330G.

In an embodiment, the color conversion panel 3000 includes a third color filter 321B disposed between the second substrate 310 and the transmission layer 330B. The third color filter 321B may transmits the blue light emitted from the display panel 1000 and passing through the transmission layer 330B, and absorb light of the remaining wavelength. Accordingly, the color purity of light emitted from a region overlapping the transmission layer 330B may be increased.

In an embodiment, the first color filter 321R may be a red color filter, the second color filter 321G may be a green color filter, and the third color filter 321B may be a blue color filter.

A blocking region BA is disposed between the red light emission region R, the green light emission region G, and the blue light emission region B. The blocking region BA may overlap at least two selected from the first color filter 321R, second color filter 321G, and third color filter 321B In an embodiment, the first color filter 321R positioned in the blocking region BA is connected to the first color filter 321R positioned in the red light emission region R, or is separated from the first color filter 321R positioned in the red light emission region R. In an embodiment, the first color filter 321R positioned in the blocking region BA may have an island form formed in a same process as the first color filter 321R positioned in the red light emission region R. In an embodiment, the second color filter 321G positioned in the blocking region BA is connected to the second color filter 321G positioned in the green light emission region G or is separated from the second color filter 321G positioned in the green light emission region G. In an embodiment, the second color filter 321G positioned in the blocking region BA it may have an island form formed in a same process as the second color filter 321G positioned in the green light emission region G. In an embodiment, the third color filter 321B positioned in the blocking region BA is connected to the third color filter 321B positioned in the blue light emission region B or is separated from the third color filter 321B positioned in the blue light emission region B. In an embodiment, the third color filter 321B in the blocking region BA may have an island form formed in a same process the third color filter 321B positioned in the blue light emission region B. In an embodiment, the color conversion panel 3000 may provide a light blocking region as a plurality of color filters overlap without a separate light blocking member.

Figure 9:
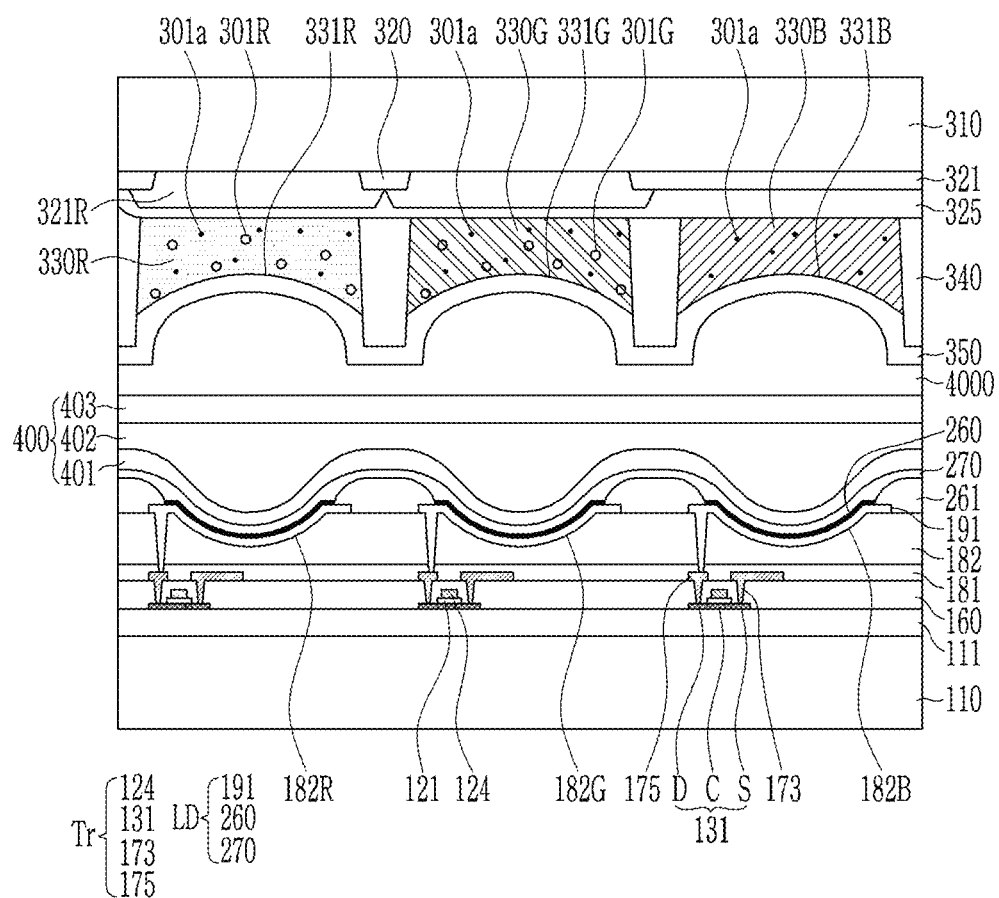

Next, referring to FIG. 9, an alternative embodiment of the display panel 1000 includes a buffer layer 111 disposed directly on the first substrate 110 and a semiconductor layer 131 disposed directly on the buffer layer 111. In such an embodiment, other constituent elements are substantially the same as those described above with reference to FIG. 1, and any repetitive detailed description thereof will be omitted.

Figure 10:
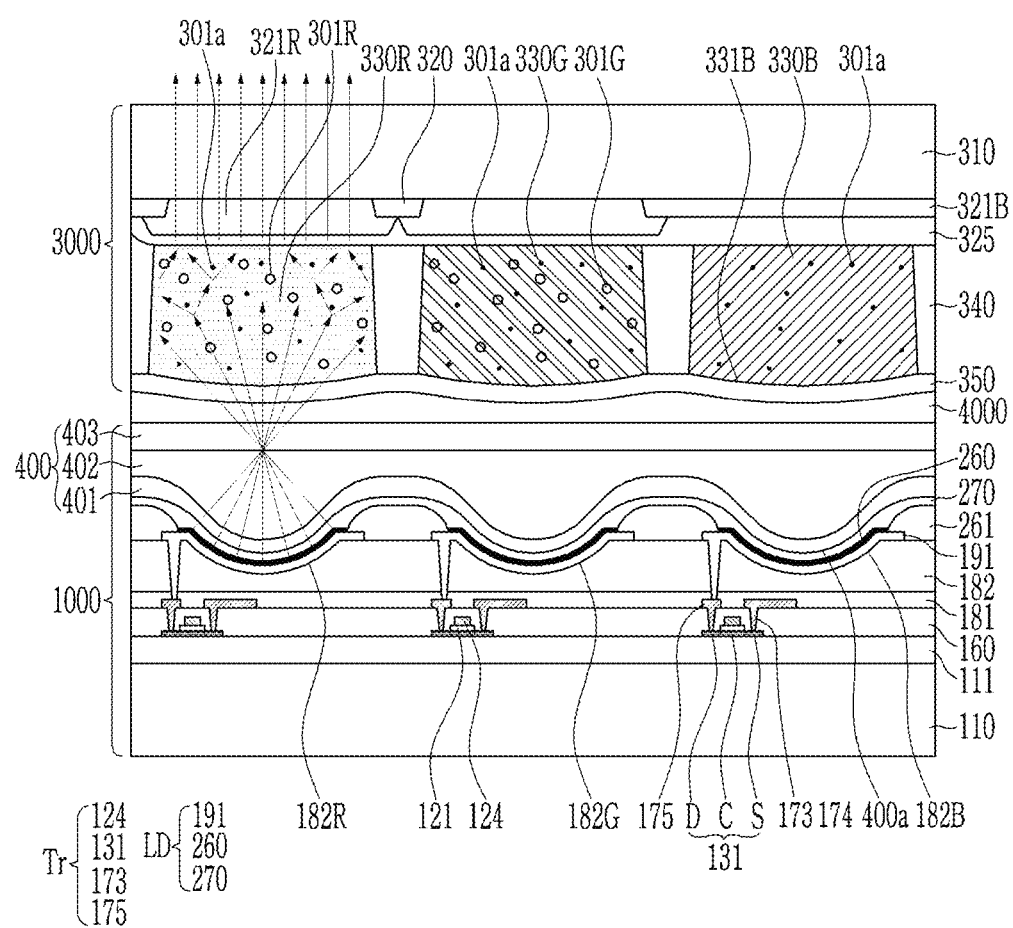

Next, referring to FIG. 10, another alternative embodiment of the display panel 1000 includes a buffer layer 111 disposed directly on the first substrate 110 and a semiconductor layer 131 disposed directly on the buffer layer 111. In such an embodiment, other constituent elements are substantially the same as those described above with reference to FIG. 2, and any repetitive detailed description thereof will be omitted.

Figure 11:
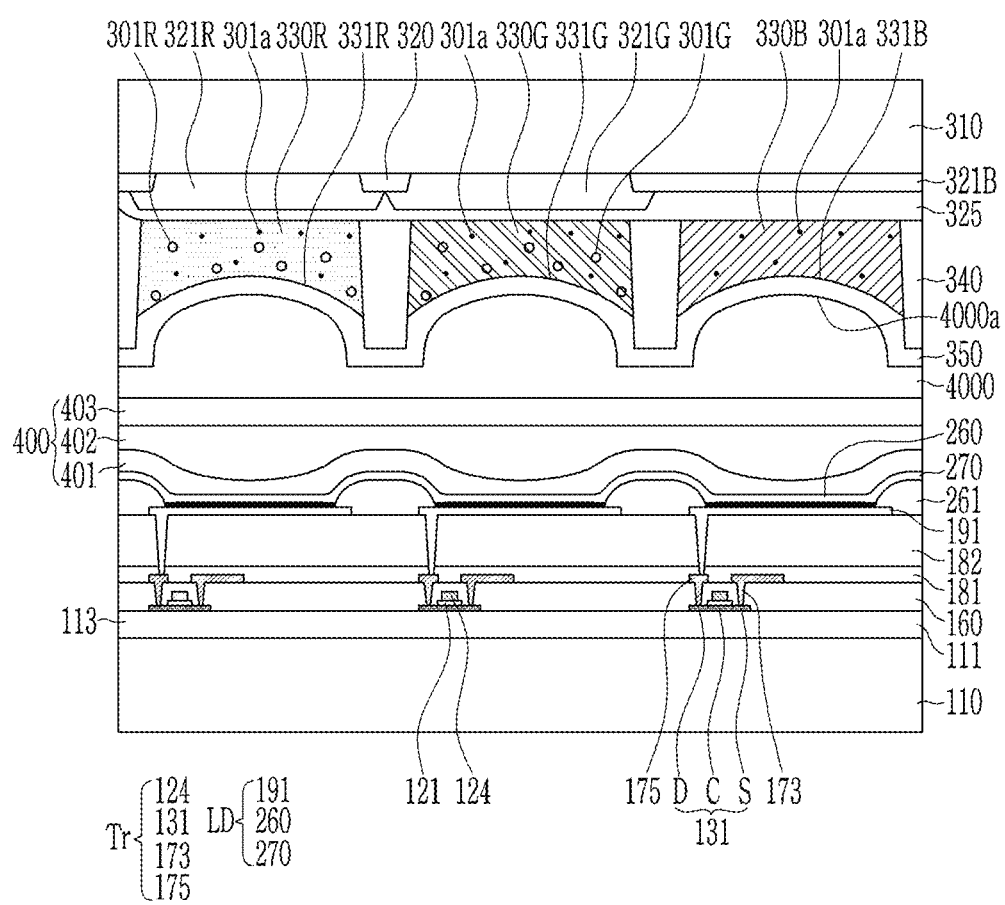

Next, referring to FIG. 11, another alternative embodiment of the display panel 1000 includes a buffer layer 111 disposed directly on the first substrate 110 and a semiconductor layer 131 disposed directly on the buffer layer 111. In such an embodiment, other constituent elements are substantially the same as those described above with reference to FIG. 3, and any repetitive detailed description thereof will be omitted.

Figure 12:
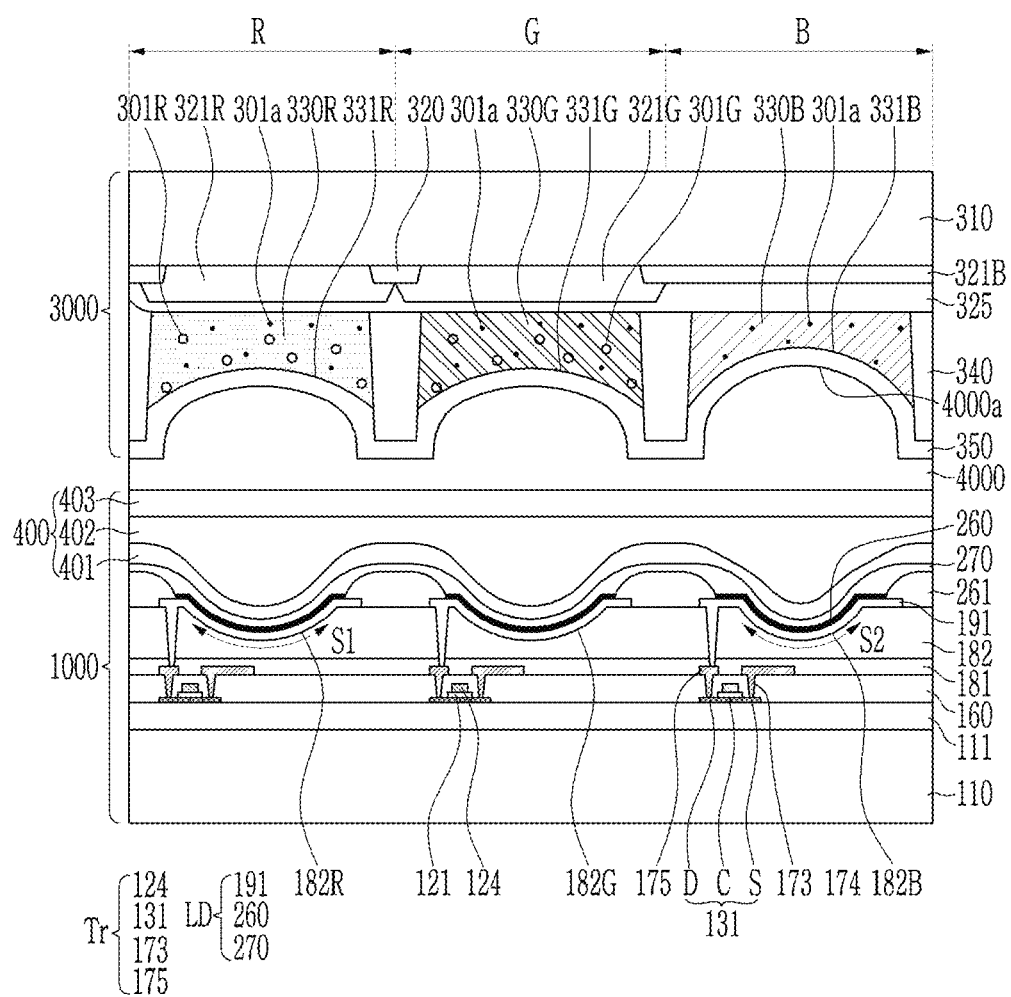

Next, referring to FIG. 12, another alternative embodiment of the display panel 1000 includes a buffer layer 111 disposed directly on the first substrate 110 and a semiconductor layer 131 disposed directly on the buffer layer 111. In such an embodiment, other constituent elements are substantially the same as those described above with reference to FIG. 4, and any repetitive detailed description thereof will be omitted.

Figure 13:
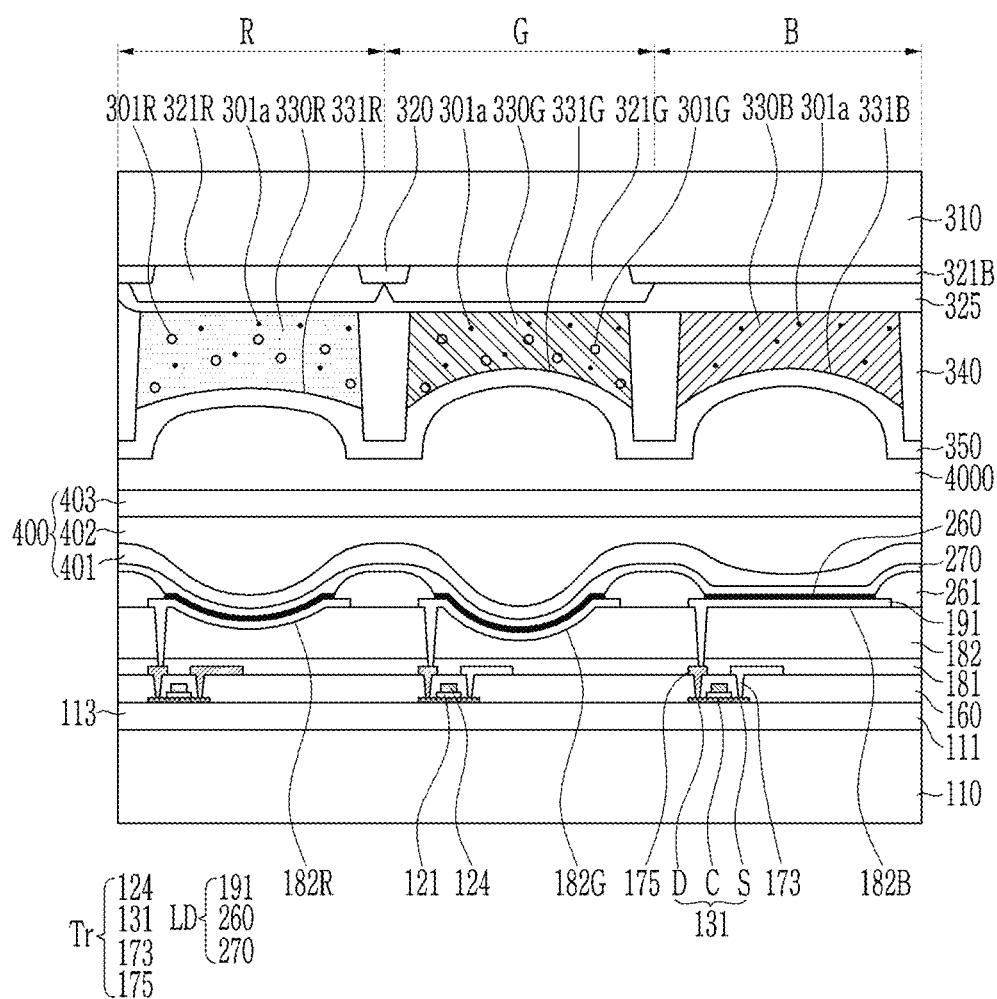

Next, referring to FIG. 13, another alternative embodiment of the display panel 1000 includes a buffer layer 111 disposed directly on the first substrate 110 and a semiconductor layer 131 disposed directly on the buffer layer 111. In such an embodiment, other constituent elements are substantially the same as those described above with reference to FIG. 5, and any repetitive detailed description thereof will be omitted.

Figure 14:
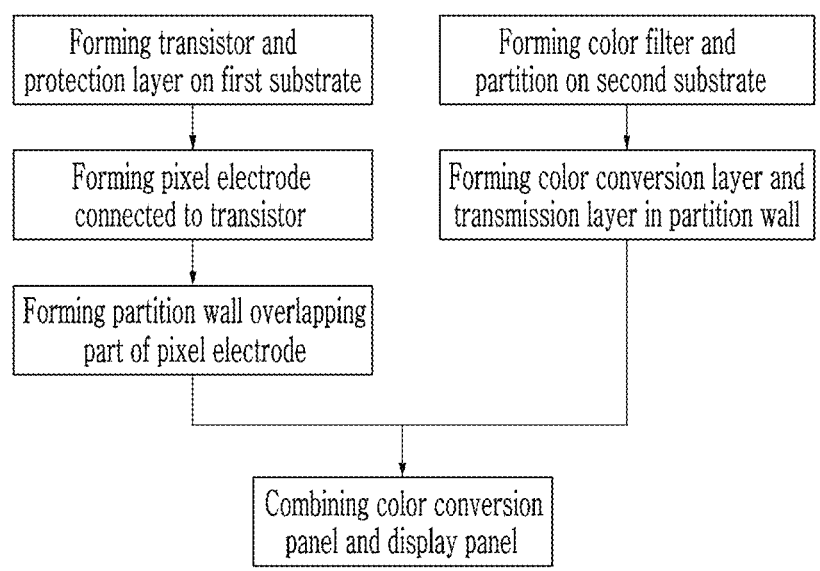
FIG. 14 is a flowchart of a manufacturing method of a display device according to an embodiment.

Hereinafter, a manufacturing method of the display device according to an embodiment will be described in detail with reference to FIG. 14 to FIG. 19. FIG. 14 is a flowchart for a manufacturing method of a display device according to an embodiment, and FIG. 15, FIG. 16, FIG. 17, FIG. 18, and FIG. 19 are schematic cross-sectional views showing a manufacturing method of a display device according to an embodiment.

Figure 15:
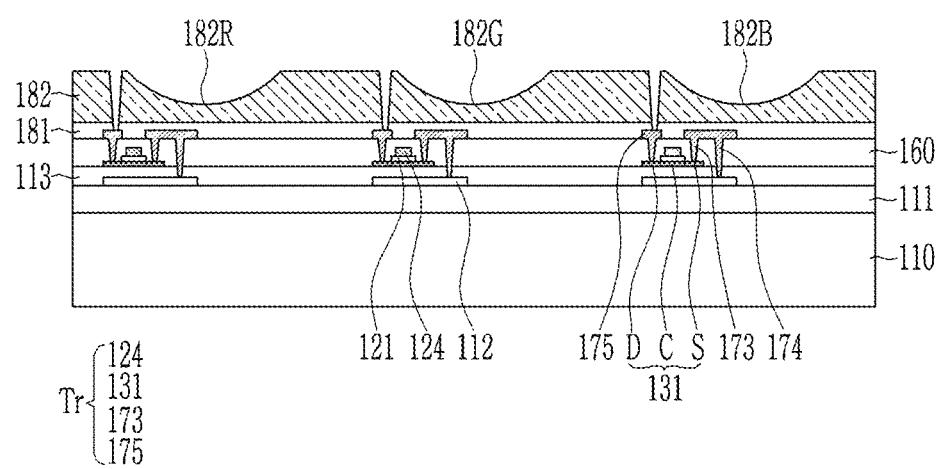
FIG. 15, FIG. 16, FIG. 17, FIG. 18, and FIG. 19 are schematic cross-sectional views showing a manufacturing method of a display device according to an embodiment.

First, referring to FIG. 14 and FIG. 15, the transistor Tr is provided or formed on the first substrate 110, and passivation layers 181 and 182 are provided or formed on the transistor Tr. FIG. 15 shows an embodiment where the passivation layers 181 and 182 are formed in a double layer structure, but the invention is not limited thereto, and may be provided in a single layer structure. In such an embodiment, the passivation layer 182 may include recess portions 182R, 182G, and 182B overlapping each light-emitting element.

The passivation layer 182 may be manufactured by any method known in the art for providing the recess portions 182R, 182G, and 182B therein. In one embodiment, for example, the recess portions 182R, 182G, and 182B of the passivation layer 182 may be manufactured using, for example, a halftone mask, a slit mask, or the like.

Figure 16:
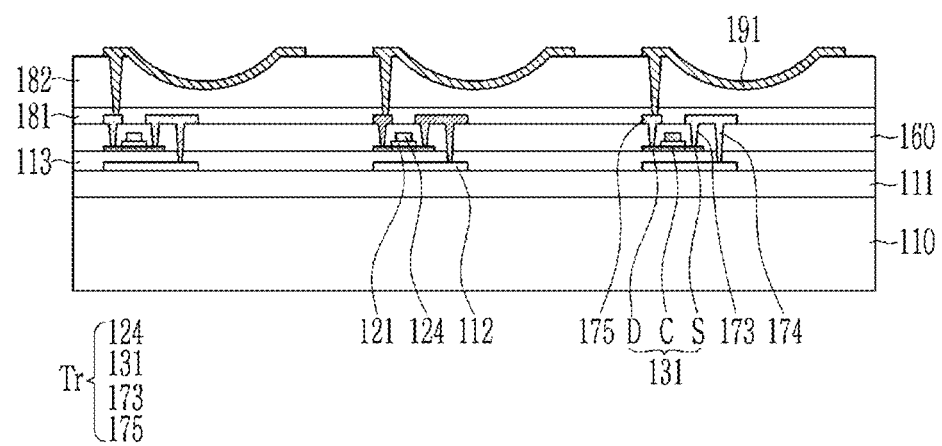

Next, referring to FIG. 14 and FIG. 16, a pixel electrode 191 is provided or formed on the second passivation layer 182. The pixel electrode 191 may be provided or formed with the concave shape along the recess portions 182R, 182G, and 182B.

Figure 17:
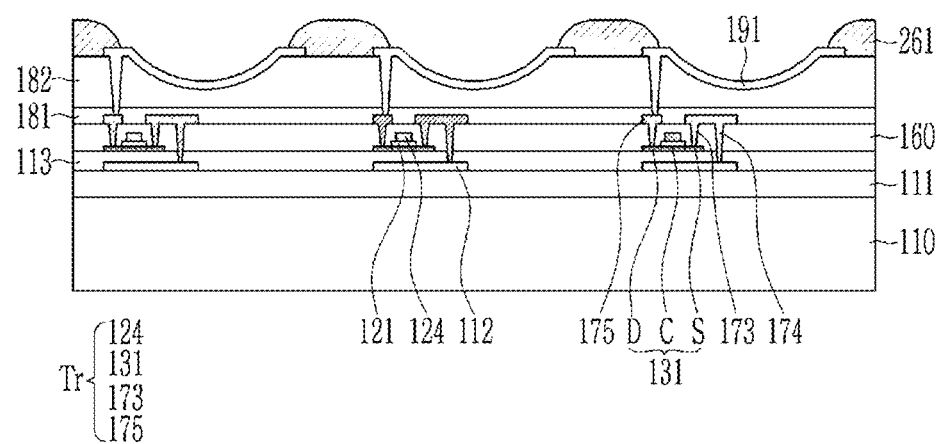

Next, as shown in FIG. 14 and FIG. 17, a partition wall 261 with an opening is provided or formed on the second passivation layer 182 and the pixel electrode 191. The partition wall 261 may define the light emission region while overlapping the pixel electrode 191. The partition wall 261 may include an organic material such as polyacryl-based resin, a polyimide-based resin, or a silica-based inorganic material.

After providing the partition wall 261, an emission layer 260 is provided or formed on the opening, and a common electrode 270 is provided or formed on the entire surface of the first substrate 110, thereby the light-emitting element LD as shown in FIG. 1 may be provided. In such an embodiment, both the emission layer 260 and the common electrode 270 may have a concave shape as the pixel electrode 191.

Then, an encapsulation layer 400 is provided or formed on the light-emitting element LD, thereby providing the display panel 1000 as shown in FIG. 1.

Figure 18:
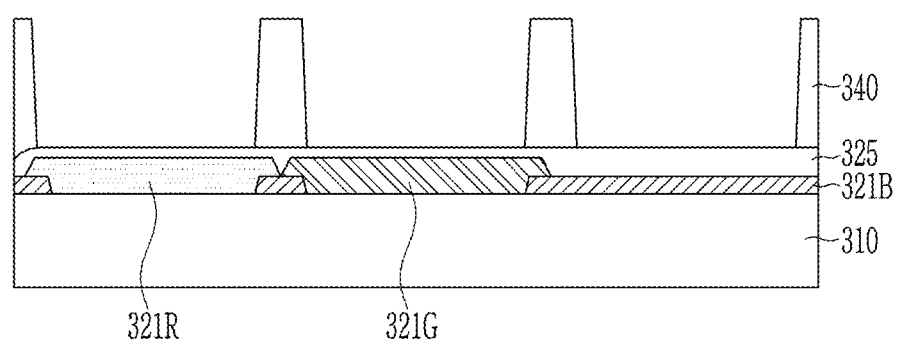

Next, referring to FIG. 14 and FIG. 18, a first color filter 321R, a second color filter 321G, and a third color filter 321B are provided or formed on the second substrate 310, and a first insulating layer 325 overlapping the entire surface of the second substrate 310 is provided or formed on the second substrate 310 to cover the first color filter 321R, the second color filter 321G, and the third color filter 321B. Next, a partition wall 340 defining a region where the color conversion layer and the transmission layer are formed is provided on the first insulating layer 325. In an embodiment, the partition wall 340 may have liquid repellency.

Figure 19:
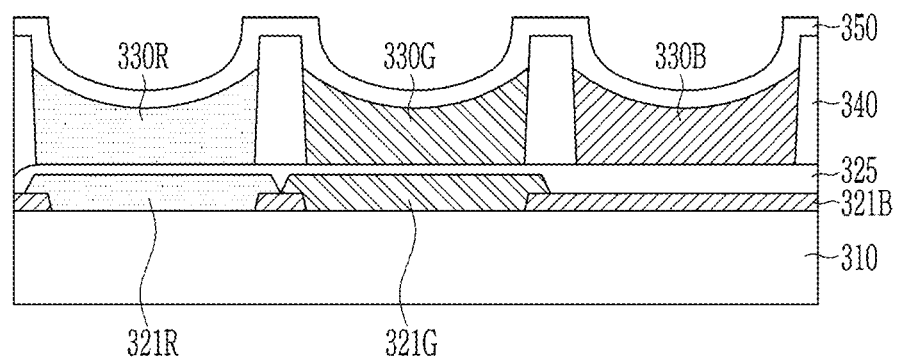

Then, referring to FIG. 14 and FIG. 19, a first color conversion layer 330R, a second color conversion layer 330G, and a transmission layer 330B may be provided or formed in the region partitioned by the partition wall 340 by using an inkjet method. When forming the first color conversion layer 330R, the second color conversion layer 330G, and the transmission layer 330B by the inkjet method, a discharged liquid for forming the first color conversion layer 330R, the second color conversion layer 330G, and the transmission layer 330B may inflow into the partition wall 340 rather than the upper surface of the partition wall 340 by the partition wall 340 having liquid repellency. The first color conversion layer 330R, the second color conversion layer 330G, and the transmission layer 330B may be formed in a concave form by such liquid repellency of the partition wall 340.

Next, a second insulating layer 350 is provided or formed on the first color conversion layer 330R, the second color conversion layer 330G, and the transmission layer 330B, thereby providing the color conversion panel 3000 shown in FIG. 1. As the second insulating layer 350 covers and protects the first color conversion layer 330R, the second color conversion layer 330G, and the transmission layer 330B, components of the filling layer injected when attaching the color conversion panel 3000 to the display panel 1000 are prevented from inflowing into the first color conversion layer 330R, the second color conversion layer 330G, and the transmission layer 330B. The second insulating layer 350 may also be formed in a concave shape along the first color conversion layer 330R, the second color conversion layer 330G, and the transmission layer 330B.

After forming the second insulating layer 350, the filling layer 4000 is filled and assembled between the display panel 1000 and the color conversion panel 3000 to form the display device. In a process of bonding the display panel 1000 and the color conversion panel 3000, foreign particles may inflow to the filling layer 4000 or the encapsulation layer 400. If the foreign particles inflow to the color conversion layers 330R and 330G, the transmission layer 330B, or the light-emitting element LD, the reliability of the display device may be lowered. In an embodiment, as each of the color conversion layers 330R and 330G, the transmission layer 330B, and the light-emitting element LD has a concave shape facing the substrate, the filling layer and the encapsulation layer filling the space therebetween may have a convex shape. Accordingly, in such an embodiment, even if foreign particles are inflowed, since the relatively thick filling layer and encapsulation layer are disposed in a region emitting light, the light-emitting element or the color conversion layer and the transmission layer are effectively prevented from being damaged.

Figure 20:
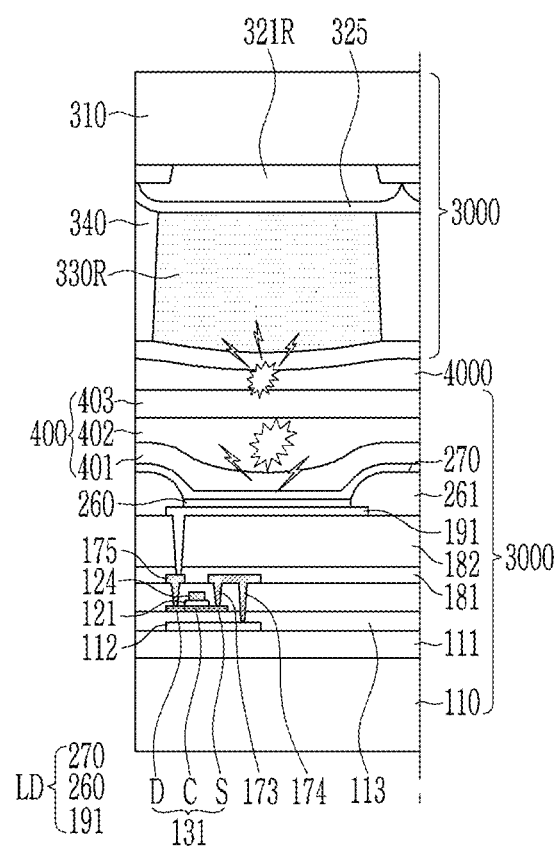
FIG. 20 is a cross-sectional view of a display device according to a comparative example.
Figure 21:
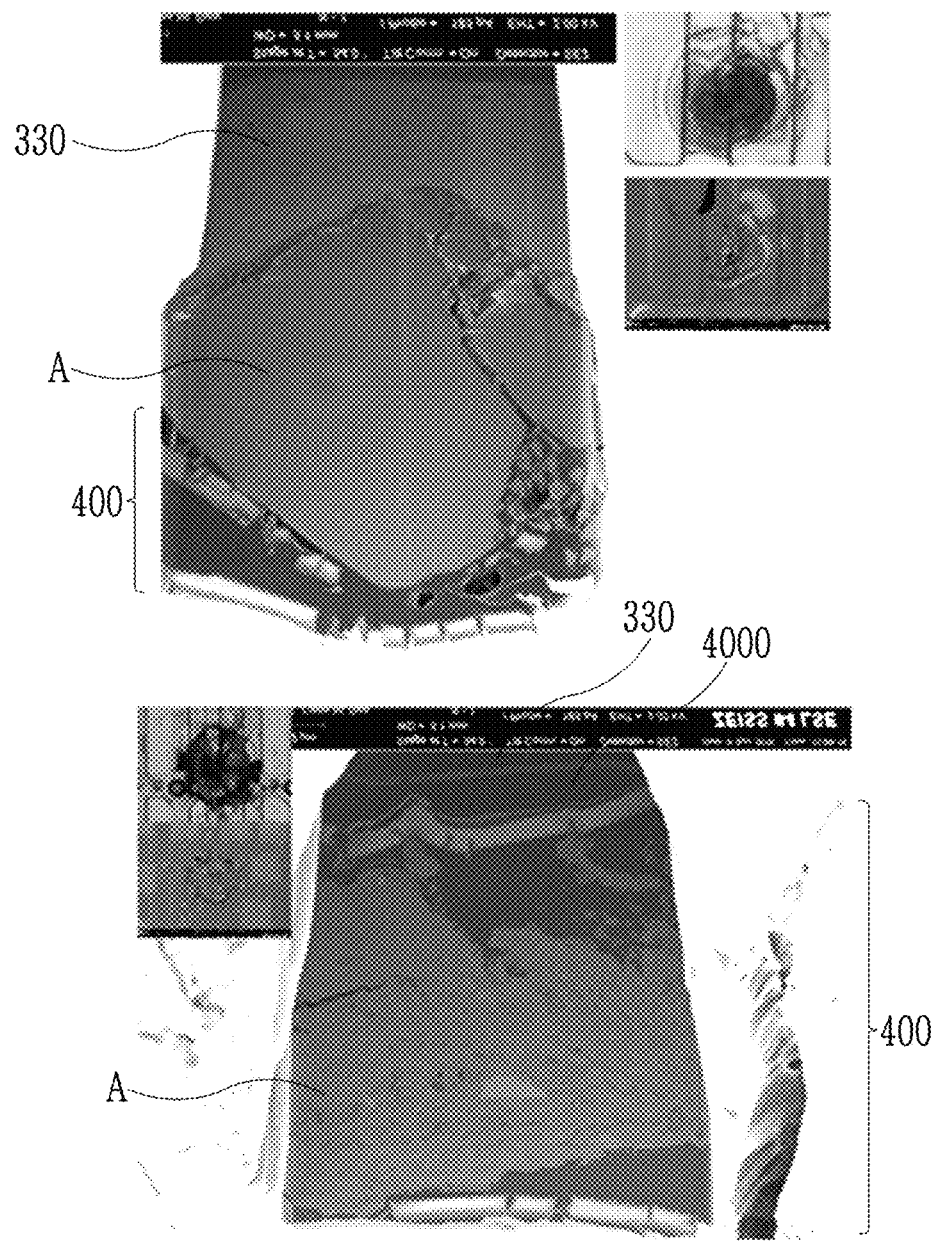
FIG. 21 is an image of a display device according to a comparative example.

Next, a display device according to a comparative example will be described with reference to FIG. 20 and FIG. 21. FIG. 20 is a cross-sectional view of a display device according to a comparative example, and FIG. 21 is an image of a display device according to a comparative example.

First, referring to FIG. 20, the display panel 1000 according to the comparative example includes a pixel electrode 191, an emission layer 260, and a common electrode 270, which have a flat surface. Therefore, the display panel 1000 according to the comparative example includes the light-emitting element LD that emits light on a flat surface.

Also, the color conversion panel 3000 according to the comparative example includes the first color conversion layer 330R having a substantially flat surface. In the comparative example, although not shown, the second color conversion layer 330G and the transmission layer 330B may have a flat surface as the first color conversion layer 330R.

In a process of bonding the display panel 1000 and the color conversion panel 3000 according to the comparative example, foreign particles easily inflow between the display panel 1000 and the color conversion panel 3000. Accordingly, in the comparative example, defects occur when foreign particles inflow to the filling layer 4000 or encapsulation layer 400 overlapping the light-emitting element LD or the color conversion layer 330R.

As shown in FIG. 21, a foreign particle A inflows between the encapsulation layer 400 and the color conversion layer 330 so that a defect of the color conversion layer is caused, or the foreign particle A inflows in the encapsulation layer 400 itself so that the defect in the light-emitting element may be caused.

However, according to an embodiment of the invention, by providing a thick encapsulation layer overlapping the light-emitting element or the thick filling layer overlapping the color conversion layer and the transmission layer, even if foreign particles inflow between the display panel and the color conversion panel, the defects of the light-emitting element, the color conversion layer, and the transmission layer may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
a display panel; and
a color conversion panel overlapping the display panel,
wherein the display panel includes:
   a transistor disposed on a first substrate;
   a light-emitting element electrically connected to the transistor; and
   a passivation layer disposed between the transistor and the light-emitting element and including a first recess portion,
   wherein the light-emitting element is disposed on the first recess portion,
wherein the color conversion panel includes a first color conversion layer, a second color conversion layer and a transmission layer, which are disposed between a second substrate and the display panel,
wherein at least one selected from the first color conversion layer, the second color conversion layer and the transmission layer overlaps the first recess portion,
wherein the at least one selected from the first color conversion layer, the second color conversion layer and the transmission layer includes a second recess portion facing the display panel, and
wherein the second recess portion is recessed in a way such that a thickness of the at least one selected from the first color conversion layer, the second color conversion layer and the transmission layer is decreased as being toward a center thereof from a side thereof.

2. The display device of claim 1, wherein
the display panel further includes an encapsulation layer disposed on the light-emitting element, and
the encapsulation layer has a flat upper surface.

3. The display device of claim 2, wherein
the encapsulation layer includes a convex part facing the first recess portion, and
the encapsulation layer includes two or more regions having different thicknesses from each other.

4. The display device of claim 2, further comprising:
a filling layer disposed between the display panel and the color conversion panel.

5. The display device of claim 1, wherein
the filling layer fills the second recess portion, and
the filling layer includes two or more regions having different thicknesses from each other.

6. The display device of claim 5, wherein
the first recess portion and the second recess portion overlap each other.

7. The display device of claim 1, wherein
the first recess portion includes:
a first-first recess portion overlapping the first color conversion layer; and a first-second recess portion overlapping the transmission layer, wherein curvatures of the first-first recess portion and the first-second recess portion are the same as each other, and an area of the first-first recess portion is larger than an area of the first-second recess portion.

8. The display device of claim 1, wherein
the first recess portion includes:
a first-first recess portion overlapping the first color conversion layer; and
a first-second recess portion overlapping the transmission layer, and a curvature of the first-first recess portion is greater than a curvature of the first-second recess portion.

9. The display device of claim 1, wherein
a planar area of the first color conversion layer is larger than a planar area of the transmission layer.

10. A display device comprising:
a display panel; and
a color conversion panel overlapping the display panel,
wherein the display panel includes:
   a transistor disposed on a first substrate; and
   a light-emitting element electrically connected to the transistor,
wherein the color conversion panel includes a first color conversion layer, a second color conversion layer and a transmission layer, which are disposed between a second substrate and the display panel,
wherein each of the first color conversion layer, the second color conversion layer and the transmission layer includes a recess portion facing the display panel, and
wherein the recess portion is recessed in a way such that a thickness of each of the first color conversion layer, the second color conversion layer and the transmission layer is decreased as being toward a center thereof from a side thereof.

11. The display device of claim 10, wherein
the light-emitting element includes a flat surface.

12. The display device of claim 10, wherein
the display panel further includes:
   a passivation layer disposed between the transistor and the light-emitting element and including a first recess portion, and
   the recess portion included in each of the first color conversion layer, the second color conversion layer and the transmission layer is a second recess portion.

13. The display device of claim 12, wherein
the first recess portion includes:
a first-first recess portion overlapping the first color conversion layer; and
a first-second recess portion overlapping the transmission layer, and
a curvature of the first-first recess portion and the first-second recess portion are the same as each other, and
an area of the first-first recess portion is larger than an area of the first-second recess portion.

14. The display device of claim 12, wherein
the first recess portion includes:
a first-first recess portion overlapping the first color conversion layer; and
a first-second recess portion overlapping the transmission layer, and a curvature of the first-first recess portion is greater than a curvature of the first-second recess portion.

15. The display device of claim 12, wherein
the light-emitting element is disposed on the first recess portion and has a concave shape.

16. The display device of claim 15, wherein
the display panel includes an encapsulation layer disposed on the light-emitting element, and
an upper surface of the encapsulation layer is flat.

17. The display device of claim 16, wherein
the encapsulation layer includes a convex part corresponding to the first recess portion, and
the encapsulation layer includes two or more regions having different thicknesses from each other.

18. The display device of claim 10, further comprising:
a filling layer disposed between the display panel and the color conversion panel.

19. The display device of claim 18, wherein
the filling layer fills the recess portion included in each of the first color conversion layer, the second color conversion layer and the transmission layer, and
the filling layer includes two or more regions having different thicknesses from each other.

\* \* \* \* \*